United States Patent
Athalye et al.

(10) Patent No.: US 9,510,413 B2
(45) Date of Patent: Nov. 29, 2016

(54) SOLID STATE LIGHTING APPARATUS AND METHODS OF FORMING

(75) Inventors: Praneet Jayant Athalye, Morrisville, NC (US); Liqin Ni, Raleigh, NC (US); Antony P. van de Ven, Sai Kung (HK); Robert D. Underwood, Santa Barbara, CA (US)

(73) Assignee: Cree, Inc., Durham, NC (US)

(*) Notice: Subject to any disclaimer, the term of this patent is extended or adjusted under 35 U.S.C. 154(b) by 1247 days.

(21) Appl. No.: 13/360,145

(22) Filed: Jan. 27, 2012

(65) Prior Publication Data

US 2013/0026923 A1  Jan. 31, 2013

Related U.S. Application Data

(63) Continuation-in-part of application No. 13/192,755, filed on Jul. 28, 2011, now Pat. No. 8,742,671, and a continuation-in-part of application No. 13/235,103, filed on Sep. 16, 2011, and a continuation-in-part of application No. 13/235,127, filed on Sep. 16, 2011.

(60) Provisional application No. 61/581,923, filed on Dec. 30, 2011.

(51) Int. Cl.
| | |
|---|---|
| *H01J 7/24* | (2006.01) |
| *H01J 13/32* | (2006.01) |
| *H01J 17/28* | (2006.01) |
| *H01J 19/74* | (2006.01) |
| *H01J 61/52* | (2006.01) |
| *H05B 33/08* | (2006.01) |
| *H01L 25/075* | (2006.01) |
| *H01L 33/54* | (2010.01) |

(52) U.S. Cl.
CPC ......... *H05B 33/083* (2013.01); *H01L 25/0753* (2013.01); *H01L 33/54* (2013.01); *H01L 2924/0002* (2013.01); *H01L 2933/005* (2013.01)

(58) Field of Classification Search
USPC .................................................. 315/112–118
See application file for complete search history.

(56) References Cited

U.S. PATENT DOCUMENTS

| | | |
|---|---|---|
| 3,755,697 A | 8/1973 | Miller |
| 3,787,752 A | 1/1974 | Delay |
| 4,090,189 A | 5/1978 | Fisler |
| 4,504,776 A | 3/1985 | Haville |

(Continued)

FOREIGN PATENT DOCUMENTS

| | | |
|---|---|---|
| CN | 1943276 A | 4/2007 |
| CN | 101137261 A | 3/2008 |

(Continued)

OTHER PUBLICATIONS

U.S. Appl. No. 12/328,144, filed Dec. 4, 2008, Chobot.

(Continued)

*Primary Examiner* — Brandon S Cole
(74) *Attorney, Agent, or Firm* — Myers Bigel, P.A.

(57) ABSTRACT

A solid state lighting apparatus can include a substrate having first and second opposing surfaces, where at least one of the opposing surfaces is configured to mount devices thereon. A string of chip-on-board light emitting diode (LED) sets, can be on the first surface of the substrate and coupled in series with one another. An ac voltage source input, from outside the solid state lighting apparatus, can be coupled to the first or second surface of the substrate.

78 Claims, 21 Drawing Sheets

(56) References Cited

U.S. PATENT DOCUMENTS

| | | | |
|---|---|---|---|
| 4,717,868 A | 1/1988 | Peterson | |
| 5,059,890 A | 10/1991 | Yoshikawa et al. | |
| 5,151,679 A | 9/1992 | Dimmick | |
| 5,175,528 A | 12/1992 | Choi et al. | |
| 5,345,167 A | 9/1994 | Hasegawa et al. | |
| 5,504,448 A | 4/1996 | Bennett et al. | |
| 5,661,645 A | 8/1997 | Hochstein | |
| 5,736,881 A | 4/1998 | Ortiz | |
| 5,803,579 A | 9/1998 | Turnbull et al. | |
| 5,844,377 A | 12/1998 | Anderson et al. | |
| 5,912,568 A | 6/1999 | Kiley | |
| 5,941,626 A | 8/1999 | Yamuro | |
| 6,137,235 A | 10/2000 | Franck | |
| 6,150,771 A | 11/2000 | Perry | |
| 6,161,910 A | 12/2000 | Reisenauer et al. | |
| 6,222,172 B1 | 4/2001 | Fossum et al. | |
| 6,285,139 B1 | 9/2001 | Ghanem | |
| 6,329,760 B1 | 12/2001 | Bebenroth | |
| 6,340,868 B1 | 1/2002 | Lys et al. | |
| 6,362,578 B1 | 3/2002 | Swanson et al. | |
| 6,388,393 B1 | 5/2002 | Illingworth | |
| 6,400,101 B1 | 6/2002 | Biebl et al. | |
| 6,528,954 B1 | 3/2003 | Lys et al. | |
| 6,556,067 B2 | 4/2003 | Henry | |
| 6,577,072 B2 | 6/2003 | Saito et al. | |
| 6,586,890 B2 | 7/2003 | Min et al. | |
| 6,614,358 B1 | 9/2003 | Hutchison et al. | |
| 6,636,003 B2 | 10/2003 | Rahm et al. | |
| 6,724,376 B2 | 4/2004 | Sakura et al. | |
| 6,747,420 B2 | 6/2004 | Barth et al. | |
| 6,784,622 B2 | 8/2004 | Newman, Jr. et al. | |
| 6,808,287 B2 | 10/2004 | Lebens et al. | |
| 6,836,081 B2 | 12/2004 | Swanson et al. | |
| 6,841,947 B2 | 1/2005 | Berg-johansen | |
| 6,873,203 B1 | 3/2005 | Latham, II et al. | |
| 6,987,787 B1 | 1/2006 | Mick | |
| 6,995,518 B2 | 2/2006 | Havlik et al. | |
| 7,038,399 B2 | 5/2006 | Lys et al. | |
| 7,061,024 B2 | 6/2006 | Schmidt et al. | |
| 7,071,762 B2 | 7/2006 | Xu et al. | |
| 7,088,059 B2 | 8/2006 | McKinney et al. | |
| 7,119,498 B2 | 10/2006 | Baldwin et al. | |
| 7,180,487 B2 | 2/2007 | Kamikawa et al. | |
| 7,202,608 B2 | 4/2007 | Robinson et al. | |
| 7,213,940 B1 | 5/2007 | Van De Ven et al. | |
| 7,218,056 B1 | 5/2007 | Harwood | |
| 7,271,545 B2 | 9/2007 | Hu et al. | |
| 7,291,983 B2 | 11/2007 | Hu et al. | |
| 7,307,391 B2 | 12/2007 | Shan | |
| 7,649,326 B2 | 1/2010 | Johnson et al. | |
| 7,688,002 B2 | 3/2010 | Ashdown et al. | |
| 7,781,979 B2 | 8/2010 | Lys | |
| 7,804,256 B2 | 9/2010 | Melanson | |
| 7,994,725 B2 | 8/2011 | Bouchard | |
| 8,174,201 B2 | 5/2012 | Lee | |
| 8,207,685 B2 | 6/2012 | Cheng et al. | |
| 8,242,704 B2 | 8/2012 | Lethellier | |
| 8,471,495 B2 | 6/2013 | Muguruma et al. | |
| 8,508,140 B2 | 8/2013 | Leung et al. | |
| 8,519,630 B2 | 8/2013 | Wang et al. | |
| 8,519,631 B2 | 8/2013 | Lee et al. | |
| 8,742,671 B2 | 6/2014 | van de Ven et al. | |
| 8,791,641 B2 | 7/2014 | van de Ven et al. | |
| 8,917,025 B2 | 12/2014 | Park et al. | |
| 8,970,131 B2 | 3/2015 | Brandes et al. | |
| 2002/0027453 A1 | 3/2002 | Kulhalli et al. | |
| 2002/0063534 A1 | 5/2002 | Min | |
| 2002/0097095 A1 | 7/2002 | Jeon et al. | |
| 2004/0036418 A1 | 2/2004 | Rooke et al. | |
| 2004/0046510 A1 | 3/2004 | Allen | |
| 2004/0189218 A1* | 9/2004 | Leong et al. | 315/291 |
| 2004/0208009 A1 | 10/2004 | Mardon et al. | |
| 2005/0057179 A1 | 3/2005 | Madhani et al. | |
| 2005/0140282 A1 | 6/2005 | Park et al. | |
| 2006/0261754 A1 | 11/2006 | Lee | |
| 2007/0013647 A1* | 1/2007 | Lee et al. | 345/102 |
| 2007/0096661 A1 | 5/2007 | Allen | |
| 2007/0108843 A1 | 5/2007 | Preston et al. | |
| 2007/0182338 A1 | 8/2007 | Shteynberg et al. | |
| 2007/0182346 A1 | 8/2007 | Shteynberg et al. | |
| 2007/0182347 A1 | 8/2007 | Shteynberg et al. | |
| 2007/0257623 A1 | 11/2007 | Johnson et al. | |
| 2007/0257999 A1 | 11/2007 | Chou | |
| 2007/0267978 A1 | 11/2007 | Shteynberg et al. | |
| 2007/0273299 A1 | 11/2007 | Miskin et al. | |
| 2007/0285031 A1 | 12/2007 | Shteynberg et al. | |
| 2008/0048567 A1 | 2/2008 | Steele et al. | |
| 2008/0094000 A1 | 4/2008 | Yamamoto et al. | |
| 2008/0116818 A1 | 5/2008 | Shteynberg et al. | |
| 2008/0122376 A1* | 5/2008 | Lys | 315/192 |
| 2008/0129220 A1 | 6/2008 | Shteynberg et al. | |
| 2008/0258628 A1 | 10/2008 | Higley et al. | |
| 2009/0039791 A1 | 2/2009 | Jones | |
| 2009/0079355 A1 | 3/2009 | Zhou et al. | |
| 2009/0079357 A1 | 3/2009 | Shteynberg et al. | |
| 2009/0079358 A1 | 3/2009 | Shteynberg et al. | |
| 2009/0079359 A1 | 3/2009 | Shteynberg et al. | |
| 2009/0079360 A1 | 3/2009 | Shteynberg et al. | |
| 2009/0079362 A1 | 3/2009 | Shteynberg et al. | |
| 2009/0108281 A1 | 4/2009 | Keller et al. | |
| 2009/0135592 A1 | 5/2009 | Hamada | |
| 2009/0170226 A1 | 7/2009 | Wall, Jr. | |
| 2009/0184616 A1 | 7/2009 | Van De Ven et al. | |
| 2009/0184662 A1 | 7/2009 | Given et al. | |
| 2009/0195168 A1 | 8/2009 | Greenfeld | |
| 2009/0251934 A1 | 10/2009 | Shteynberg et al. | |
| 2009/0284172 A1 | 11/2009 | Maschietto et al. | |
| 2010/0026208 A1 | 2/2010 | Shteynberg et al. | |
| 2010/0045187 A1 | 2/2010 | Shteynberg et al. | |
| 2010/0060175 A1 | 3/2010 | Lethellier | |
| 2010/0072902 A1 | 3/2010 | Wendt et al. | |
| 2010/0109537 A1 | 5/2010 | Nishino et al. | |
| 2010/0109557 A1* | 5/2010 | Bouchard | 315/294 |
| 2010/0109564 A1 | 5/2010 | Shin et al. | |
| 2010/0109570 A1 | 5/2010 | Weaver | |
| 2010/0156763 A1 | 6/2010 | Lee et al. | |
| 2010/0194274 A1 | 8/2010 | Hoogzaad | |
| 2010/0207150 A1 | 8/2010 | Grajcar | |
| 2010/0213859 A1 | 8/2010 | Shteynberg et al. | |
| 2010/0231135 A1 | 9/2010 | Hum et al. | |
| 2010/0246197 A1 | 9/2010 | Takahashi et al. | |
| 2010/0252851 A1 | 10/2010 | Emerson et al. | |
| 2010/0264832 A1 | 10/2010 | Archenhold et al. | |
| 2010/0295460 A1 | 11/2010 | Lin et al. | |
| 2010/0308738 A1 | 12/2010 | Shteynberg et al. | |
| 2010/0308739 A1 | 12/2010 | Shteynberg et al. | |
| 2010/0315016 A1 | 12/2010 | Hoogzaad | |
| 2010/0327746 A1 | 12/2010 | Hisayasu | |
| 2010/0327765 A1 | 12/2010 | Melanson et al. | |
| 2011/0025217 A1 | 2/2011 | Zhan et al. | |
| 2011/0068701 A1 | 3/2011 | van de Ven et al. | |
| 2011/0101883 A1* | 5/2011 | Grajcar | 315/291 |
| 2011/0109228 A1 | 5/2011 | Shimomura et al. | |
| 2011/0109244 A1 | 5/2011 | Grajcar | |
| 2011/0115394 A1 | 5/2011 | Shteynberg et al. | |
| 2011/0115411 A1 | 5/2011 | Shteynberg et al. | |
| 2011/0121754 A1 | 5/2011 | Shteynberg et al. | |
| 2011/0169417 A1 | 7/2011 | Hum et al. | |
| 2011/0180818 A1 | 7/2011 | Lerman et al. | |
| 2011/0181194 A1 | 7/2011 | Hum et al. | |
| 2011/0193467 A1 | 8/2011 | Grajcar | |
| 2011/0199003 A1* | 8/2011 | Muguruma et al. | 315/122 |
| 2011/0210678 A1 | 9/2011 | Grajcar | |
| 2011/0273102 A1 | 11/2011 | van de Ven et al. | |
| 2012/0091920 A1 | 4/2012 | Yang | |
| 2012/0099321 A1 | 4/2012 | Scott et al. | |
| 2012/0176826 A1 | 7/2012 | Lazar | |
| 2012/0194073 A1 | 8/2012 | Wang et al. | |
| 2013/0278157 A1 | 10/2013 | Radermacher | |

FOREIGN PATENT DOCUMENTS

| | | |
|---|---|---|
| CN | 101227780 A | 7/2008 |
| CN | 101529983 A | 9/2009 |

(56) References Cited

FOREIGN PATENT DOCUMENTS

| CN | 201396582 Y | 2/2010 |
|---|---|---|
| CN | 101668373 A | 3/2010 |
| CN | 101772245 A | 7/2010 |
| CN | 101779522 A | 7/2010 |
| CN | 101827481 A | 9/2010 |
| CN | 101994932 A | 3/2011 |
| CN | 201758472 A | 3/2011 |
| CN | 102804926 A | 11/2012 |
| JP | 2006-040669 A | 2/2006 |
| TW | I294256 | 3/2008 |
| WO | WO 2005/084080 A2 | 9/2005 |
| WO | WO 2006/018604 A1 | 2/2006 |
| WO | WO 2009/013676 A2 | 1/2009 |
| WO | WO 2012/005771 A2 | 1/2012 |

OTHER PUBLICATIONS

U.S. Appl. No. 12/328,115, filed Dec. 4, 2008, Chobot.
U.S. Appl. No. 11/854,744, filed Sep. 13, 2007, Myers.
U.S. Appl. No. 60/844,325, filed Sep. 13, 2006, Myers.
EXM020, Multi-Channel 160W LED Driver, Rev. 2.0 Nov. 2010, 13 pages, www.exclara.com.
EXM055, 14.8W Dimmable LED Ballast, Rev. 0.7, Mar. 11, 2011, 10 pages, www.exclara.com.
EXM057, 14.5W Dimmable LED Ballast, Rev. 0.5, Mar. 11, 2011, 8 pages, www.exclara.com.
International Preliminary Report on Patentability corresponding to International Application No. PCT/US2010/029897; Date of Mailing: Apr. 27, 2011; 14 pages.
International Search Report and Written Opinion, PCT/US2010/048567, Oct. 29, 2010.
Notification of transmittal of the international search report and the written opinion of the international searching authority, or declaration, PCT/US2010/029897, Jun. 23, 2010.
Donofrio M., "Light Emitting Diode (Led) Arrays Including Direct Die Attach and Related Assemblies", U.S. Appl. No. 13/027,006, filed Feb. 14, 2011, 57 pages.
Donofrio M. et al., "Reflective Mounting Substrates for Flip-Chip Mounted Horizontal Leds", U.S. Appl. No. 13/178,791, filed Jul. 8, 2011, 56 pages.
Emerson D.T. et al., "Gap Engineering for Flip-Chip Mounted Horizontal Leds", U.S. Appl. No. 13/112,502, filed May 20, 2011, 51 pages.
Bergquist Company, "T-Clad Overview, Thermal Substrates", http://www.bergquistcompany.com/thermal_substrates/t-clad-product-overview.htm, 3 pages.
Cree, "XLamp XM-L LEDs, leading the revolution in LED lighting", http://www.cree.com/led-components-and-modules/products/xlamp/discrete-nondirectional/xlamp-xml-hvw, 3 pages.
Cree, "XLamp XT-E LEDs, leading the revolution in LED lighting", http://www.cree.com/led-components-and-modules/products/xlamp/discrete-nondirectional/xlamp-xte-hvw, 3 pages.
Acriche, Technical Data Sheet, "Designing with Acrich 2", Aug. 2011, www.Acrich.com, 1 page.
Yung, Winco K.C., "Using Metal Core Printed Circuit Board (MCPCB) as a Solution for Thermal Management", *Journal of the HKPCA*, Issue No. 24, 2007, 5 pages.
Lumitech, "Chip on Board (COB) LED Module", http://vvww.lumitech.bnet.at/chip-on-board-cob-led-module_11.htm, 2 pages.
International Search Report Corresponding to International Application No. PCT/US2012/047344; Date of Mailing: Dec. 3, 2012; 16 Pages.
International Search Report Corresponding to International Application No. PCT/US12/47643; Date of Mailing: Oct. 25, 2012; 10 Pages.
International Search Report Corresponding to International Application No. PCT/US2012/054384; Date of Mailing: Nov. 26, 2012; 13 Pages.
International Search Report Corresponding to International Application No. PCT/US12/54869; Date of Mailing: Nov. 23, 2012; 10 Pages.
International Search Report Corresponding to International Application No. PCT/US12/54888; Date of Mailing: Nov. 23, 2012; 12 Pages.
International Preliminary Report on Patentability Corresponding to International Application No. PCT/US2012/054384; Date of Mailing: Mar. 27, 2014; 11 Pages.
International Preliminary Report on Patentability Corresponding to International Application No. PCT/US2012/054869; Date of Mailing: Mar. 27, 2014; 8 Pages.
International Preliminary Report on Patentability Corresponding to International Application No. PCT/US2012/054888; Date of Mailing: Mar. 27, 2014; 10 Pages.
Chinese First Office Action and Search Report Corresponding to Chinese Application No. 201280044036.9; Date of Notification: Feb. 12, 2015; Foreign Text, 10 Pages, English Translation Thereof, 8 Pages.
Chinese First Office Action and Search Report Corresponding to Chinese Application No. 201280054168.X; Date of Notification: Feb. 12, 2015; Foreign Text, 8 Pages, English Translation Thereof, 8 Pages.
Chinese Office Action Corresponding to Chinese Patent Application No. 201280052473.5; Date of Notification: Jan. 4, 2015; 14 Pages.
Chinese Office Action Corresponding to Chinese Patent Application No. 201280044038.8; Date of Notification: Dec. 12, 2014; Foreign Text, 16 Pages, English Translation Thereof, 7 Pages.
Chinese Second Office Action and Search Report Corresponding to Chinese Application No. 201280044036.9; Date of Notification: Dec. 3, 2015; Foreign Text, 13 pages, English Translation Thereof, 9 pages.
Taiwanese Office Action Corresponding to Application No. 101131404; Dated: Nov. 19, 2015; Foreign Text, 15 pages, English Translation Thereof, 9 pages.
European Search Report Corresponding to European Application No. 12 83 2595; Dated: Oct. 7, 2015; 6 Pages.

\* cited by examiner

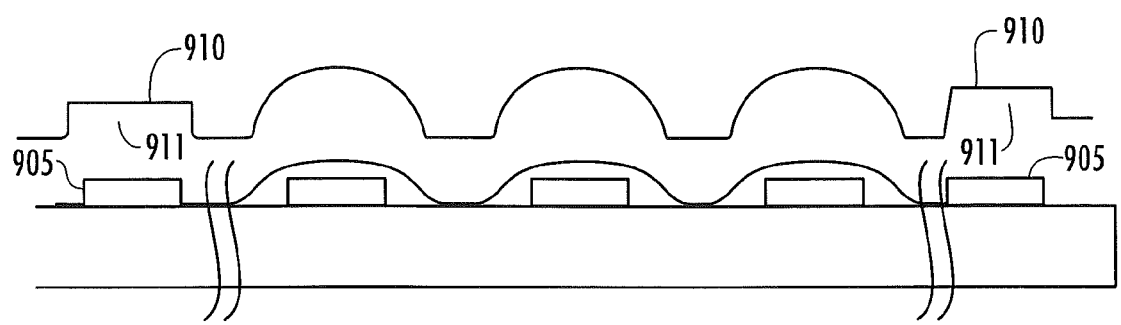
FIG. 9
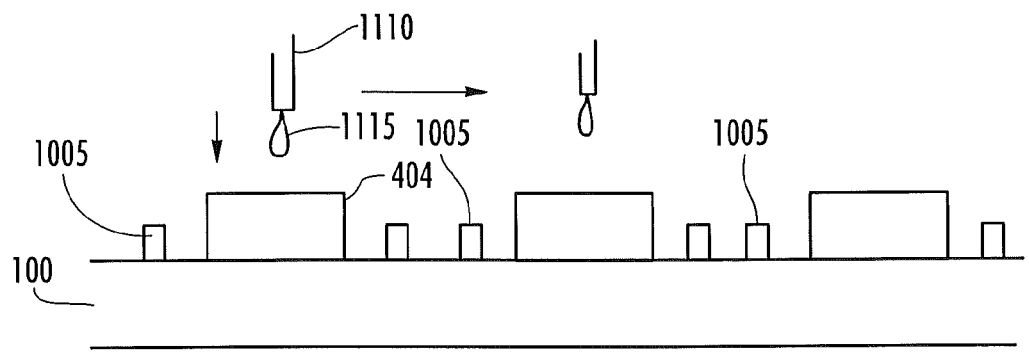
FIG. 10A
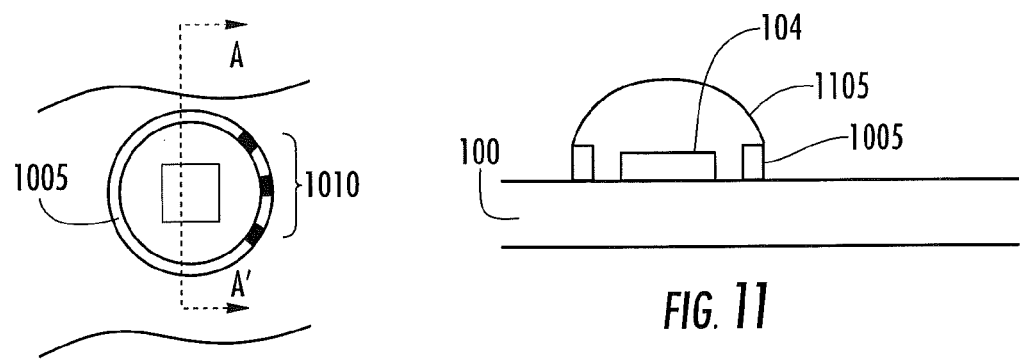
FIG. 10B
FIG. 11

| COMPONENT | POWER (W) | AC VOLTAGE (V) | AC CURRENT (V) | POWER FACTOR (W/VA) | CURRENT THD (%) | | EFFICACY (Lm/W) | ccx | ccy | u' | v' | CCT_K | CRI |
|---|---|---|---|---|---|---|---|---|---|---|---|---|---|
| 10 | 9.245 | 120.3 | 0.078 | 0.980 | 20.39 | 728 | 78.76 | 0.4297 | 0.3868 | 0.2534 | 0.5133 | 2981 | 78.4 |
| 3 | 9.099 | 120.3 | 0.077 | 0.978 | 21.29 | 704 | 77.350 | 0.4324 | 0.3910 | 0.2533 | 0.5154 | 2969 | 78.5 |
| AVERAGE | 9.172 | 120.3 | 0.078 | 0.979 | 20.84 | 716 | 78.055 | 0.431 | 0.389 | 0.253 | 0.514 | 2975 | 78.5 |
| 1 | 10.913 | 120.3 | 0.093 | 0.973 | 23.70 | 816 | 74.73 | 0.4320 | 0.3897 | 0.2537 | 0.5148 | 2964 | 78.5 |
| 9 | 10.605 | 120.3 | 0.090 | 0.977 | 21.81 | 798 | 75.22 | 0.4296 | 0.3874 | 0.2531 | 0.5135 | 2987 | 78.4 |
| 6 | 11.016 | 120.3 | 0.094 | 0.970 | 25.10 | 793 | 71.97 | 0.4312 | 0.3903 | 0.2529 | 0.5150 | 2982 | 78.5 |
| AVERAGE | 10.845 | 120.30 | 0.093 | 0.973 | 23.54 | 802 | 73.97 | 0.4309 | 0.3891 | 0.2532 | 0.5144 | 2978 | 78.5 |

FIG. 14

| COMPONENT | POWER (W) | AC VOLTAGE (V) | AC CURRENT (V) | POWER FACTOR (W/VA) | CURRENT THD (%) | LUMINOUS FLUX (Lm) | EFFICACY (Lm/W) | ccx | ccy | u' | v' | CCT_K | CRI |
|---|---|---|---|---|---|---|---|---|---|---|---|---|---|
| 10 | 10.951 | 120.3 | 0.094 | 0.968 | 25.91 | 785 | 71.67 | 0.4308 | 0.3870 | 0.2541 | 0.5135 | 2962 | 78.6 |
| 6 | 9.851 | 120.3 | 0.084 | 0.970 | 25.00 | 724 | 73.49 | 0.4302 | 0.3858 | 0.2542 | 0.5130 | 2961 | 78.6 |
| 19 | 10.056 | 120.3 | 0.086 | 0.967 | 26.06 | 721 | 71.68 | 0.4267 | 0.3849 | 0.2523 | 0.5121 | 3017 | 79.2 |
| 5 | 9.819 | 120.3 | 0.085 | 0.966 | 26.43 | 718 | 73.16 | 0.4294 | 0.3866 | 0.2533 | 0.5132 | 2984 | 78.5 |
| 16 | 10.011 | 120.3 | 0.086 | 0.968 | 25.68 | 715 | 71.45 | 0.4262 | 0.3835 | 0.2526 | 0.5114 | 3014 | 79.1 |
| 4 | 9.836 | 120.3 | 0.085 | 0.967 | 26.03 | 714 | 72.58 | 0.4298 | 0.3890 | 0.2525 | 0.5142 | 2996 | 78.6 |
| 9 | 10.019 | 120.3 | 0.086 | 0.969 | 25.38 | 709 | 70.75 | 0.4313 | 0.3864 | 0.2547 | 0.5134 | 2948 | 78.0 |
| 19 | 10.102 | 120.3 | 0.087 | 0.970 | 24.78 | 705 | 69.80 | 0.4258 | 0.3844 | 0.2519 | 0.5117 | 3029 | 79.2 |
| 3 | 9.568 | 120.3 | 0.082 | 0.968 | 25.73 | 689 | 71.97 | 0.4299 | 0.3889 | 0.2526 | 0.5142 | 2993 | 78.6 |
| 17 | 9.668 | 120.3 | 0.083 | 0.968 | 25.57 | 686 | 70.99 | 0.4278 | 0.3867 | 0.2522 | 0.5130 | 3014 | 79.3 |
| 20 | 9.550 | 120.3 | 0.082 | 0.968 | 25.74 | 674 | 70.60 | 0.4263 | 0.3852 | 0.2519 | 0.5121 | 3029 | 79.3 |
| AVERAGES | 9.948 | 120.3 | 0.085 | 0.968 | 25.66 | 713 | 71.65 | 0.4286 | 0.3862 | 0.2529 | 0.5129 | 2995 | 78.8 |

FIG. 15

SOLID STATE LIGHTING APPARATUS AND METHODS OF FORMING

CROSS-REFERENCE TO RELATED APPLICATIONS AND CLAIMS FOR PRIORITY

This application claims priority to U.S. Provisional Patent Application No. 61/581,923, filed Dec. 30, 2011, and is a continuation-in-part of, claims the priority of, and is related to, commonly assigned U.S. application Ser. No. 13/192,755, entitled Solid State Lighting Apparatus and Methods Using Integrated Driver Circuitry filed on Jul. 28, 2011, now U.S. Pat. No. 8,742,671 U.S. application Ser. No. 13/235,103, entitled Solid State Lighting Apparatus And Methods Using Energy Storage, filed on Sep. 16, 2011, and U.S. application Ser. No. 13/235,127, entitled Solid State Lighting Apparatus And Methods Using Current Diversion Controlled By Lighting Device Bias States filed on Sep. 16, 2011, the disclosures of all of which are hereby incorporated herein by reference in their entireties.

FIELD

The present inventive subject matter relates to lighting apparatus and methods and, more particularly, to solid state lighting apparatus and methods of forming.

BACKGROUND

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs), which may include inorganic LEDs, which may include semiconductor layers forming p-n junctions and/or organic LEDs (OLEDs), which may include organic light emission layers.

Solid state lighting arrays are used for a number of lighting applications. For example, solid state lighting panels including arrays of solid state light emitting devices have been used as direct illumination sources, for example, in architectural and/or accent lighting. A solid state light emitting device may include, for example, a packaged light emitting device including one or more light emitting diodes (LEDs). Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region.

Solid state lighting panels are commonly used as backlights for small liquid crystal display (LCD) screens, such as LCD display screens used in portable electronic devices. In addition, there has been increased interest in the use of solid state lighting panels as backlights for larger displays, such as LCD television displays.

Although solid state light sources having high coloring rendering index (CRI) and/or high efficiency have been demonstrated, one problem with the large-scale adoption of such light sources in architectural applications is that commercial lighting systems utilize lamps with standardized connectors that are designed to be used with alternating current (ac) power, which may be phase cut using a phase cutting dimmer device. Typically, a solid state lighting source is provided or coupled with a power converter that converts ac power into dc power, and the dc power is used to energize the light source. However, the use of such power converters may increase the cost of the lighting source and/or the overall installation, and may reduce efficiency.

Some attempts at providing solid state lighting sources have involved driving an LED or string or group of LEDs using a rectified ac waveform. However, because the LEDs require a minimum forward voltage to turn on, the LEDs may turn on for only a part of the rectified ac waveform, which may result in visible flickering, may undesirably lower the power factor of the system, and/or may increase resistive loss in the system.

Other attempts at providing ac-driven solid state lighting sources have involved placing LEDs in an anti-parallel configuration, so that half of the LEDs are driven on each half-cycle of an ac waveform. However, this approach requires twice as many LEDs to produce the same luminous flux as using a rectified ac signal.

SUMMARY

A solid state lighting apparatus can include a substrate having first and second opposing surfaces, where at least one of the opposing surfaces is configured to mount devices thereon. A string of chip-on-board (COB) light emitting diode (LED) sets, can be on the first surface of the substrate and coupled in series with one another. An ac voltage source input, from outside the solid state lighting apparatus, can be coupled to the first or second surface of the substrate.

In some embodiments according to the invention, a solid state lighting apparatus can include a rectifier circuit that is mounted on a surface of a substrate housed in the solid state lighting apparatus, coupled to an ac voltage source configured to provide a rectified ac voltage to the substrate. A current source circuit can be mounted on the surface of the substrate and coupled to the rectifier circuit. A string of light emitting diode (LED) sets, can be mounted on the surface of the substrate, and coupled in series with one another and to the current source circuit. A plurality of current diversion circuits can be mounted on the surface of the substrate, where respective ones of which are coupled to respective nodes of the string and can be configured to operate responsive to bias state transitions of respective ones of the LED sets.

In some embodiments according to the invention, at least the plurality of current diversion circuits includes discrete electronic component packages that can be mounted on the substrate. In some embodiments according to the invention, the LEDs in the string can be chip-on-board LEDs that are mounted on the surface of the substrate. In some embodiments according to the invention, the substrate can be a flexible circuit substrate, where the apparatus can further include a heat sink that can be mounted on an opposing surface of the substrate, and thermally coupled to the string of LED sets. In some embodiments according to the invention, the substrate can be a metal core printed circuit board (MCPCB).

In some embodiments according to the invention, a solid state lighting apparatus can include a rectifier circuit that can be configured to be coupled to an ac power source to provide a rectified ac voltage. A current source circuit can be coupled to the rectifier circuit and a string of serially-connected LED sets can be coupled to an output of the current source circuit. At least one capacitor can be coupled to the output of the current source circuit. A current limiter circuit can include a current mirror circuit that is configured to limit a current through at least one of the LED sets to less than a current produced by the current source circuit and to cause the at least one capacitor to be selectively charged via the current source circuit and discharged via the at least one of the LED sets responsive to the rectified ac voltage applied to an input of the current source circuit. A plurality of current diversion circuits can be coupled to respective nodes between LEDs in the string and configured to be selectively enabled and disabled responsive to bias state transitions of the LED sets as a magnitude of the rectified ac voltage varies.

In some embodiments according to the invention, the plurality of current diversion circuits can each include a transistor that can provide a controllable current path between a first node of the string and a terminal of the rectifier circuit and a turn-off circuit coupled to a second node of the string and to a control terminal of the transistor and that can be configured to control the current path responsive to a control input.

In some embodiments according to the invention, the apparatus can also include a substrate having first and second opposing surfaces, where at least the string of serially-connected LED sets, the plurality of current diversion circuits, the rectifier circuit, and the current source circuit are mounted on the substrate. In some embodiments according to the invention, the LEDs in the string can be chip-on-board LEDs mounted on the substrate.

In some embodiments according to the invention, the substrate can be a flexible circuit board, where the apparatus can further include a heat sink that is mounted on the substrate opposite and proximate to the string of LED sets. In some embodiments according to the invention, the substrate can be a metal core printed circuit board (MCPCB).

In some embodiments according to the invention, a method of forming a solid state lighting circuit can be provided by placing a plurality chip-on-board light emitting diodes (LEDs) in a string configuration on a surface of a substrate. An encapsulant material can be applied over the plurality of chip-on-board LEDs and the encapsulant material can be formed into a layer covering the plurality of chip-on-board LEDs to provide lenses for the plurality of chip-on-board LEDs.

In some embodiments according to the invention, the method can also include placing a plurality of current diversion circuits, including discrete electronic component packages, on the surface of the substrate. In some embodiments according to the invention, applying an encapsulant material can be provided by applying the encapsulant material to cover the plurality of chip-on-board LEDs and portions of the surface between ones of the plurality of chip-on-board LEDs.

In some embodiments according to the invention, forming the encapsulant material into a layer can be provided by bringing a mold into contact with the encapsulant material to simultaneously form a layer covering the plurality chip-on-board LEDs to provide the lenses for the plurality chip-on-board LEDs, wherein the mold includes chip-on-board LED recesses positioned in a surface of the mold opposite the plurality of chip-on-board LEDs.

In some embodiments according to the invention, the method can further include placing a plurality of current diversion circuits, including discrete electronic component packages, on the surface of the substrate before applying the encapsulant material, wherein the mold further includes discrete electronic component package recesses positioned in the surface of the mold opposite the plurality of current diversion circuits on the surface. In some embodiments according to the invention, applying an encapsulant material can be provided by dispensing the encapsulant material separately onto the plurality of chip-on-board LEDs.

In some embodiments according to the invention, applying an encapsulant material can be provided by dispensing the encapsulant material simultaneously onto the plurality of chip-on-board LEDs. In some embodiments according to the invention, forming the encapsulant material into a layer covering the plurality chip-on-board LEDs to provide lenses for the plurality chip-on-board LEDs can be provided by respective encapsulant barriers to a flow of the encapsulant material away from each of the plurality chip-on-board LEDs during application of the encapsulant material to provide a respective lens for each of the plurality of chip-on-board LEDs.

In some embodiments according to the invention, the encapsulant barrier at least partially surrounds the LEDs and is configured to reduce a flow of the encapsulant material away from the LEDs during application of the encapsulant material to promote the formation of the lenses. In some embodiments according to the invention, the method can further include removing the encapsulant barriers from the lenses.

In some embodiments according to the invention, a printed circuit board (PCB) can include a substrate, that is configured for inclusion in a solid state lighting apparatus, where the substrate can have first and second opposing surfaces, where at least one of which is configured to mount a plurality of chip-on-board light emitting diodes (LEDs) thereon, and the substrate configured to couple to an ac voltage source input, from outside the solid state lighting apparatus, and configured for mounting a plurality of discrete current diversion circuits devices thereon coupled to respective nodes between ones of the LEDs and configured to be selectively enabled and disabled responsive to bias state transitions of the LED sets as a magnitude of a rectified ac voltage provided to the LEDs varies.

In some embodiments according to the invention, the substrate can be a metal core PCB. In some embodiments according to the invention, the first surface can be a conductive circuit pattern layer and the second surface can be a base metal layer having a greater thickness than the conductive circuit pattern layer, where the PCB can further include a dielectric layer that is between the conductive circuit pattern layer and the base metal layer.

In some embodiments according to the invention, the substrate can be a flexible PCB.

In some embodiments according to the invention, the PCB can further include a thermally conductive slug in the substrate at a particular position opposite where the string of chip-on-board LED sets are to be mounted thereon. In some embodiments according to the invention, the PCB can further include an encapsulant barrier, protruding from the surface, at least partially surrounding a position on the surface where at least one of the LEDs is to be mounted, configured to reduce a flow of an encapsulant material away from the LEDs during application of the encapsulant material to promote the formation of a lens on the at least one of the LEDs.

BRIEF DESCRIPTION OF THE DRAWINGS

FIGS. 6-9 are cross-sectional views illustrating methods of forming a solid state apparatus on a circuit substrate including chip-on-board LEDs mounted thereon using a mold in some embodiments according to the invention.

FIGS. 10-12 are cross-sectional views illustrating methods of forming a solid state lighting apparatus including chip-on-board LEDs using encapsulate barriers on a circuit substrate in some embodiments according to the invention.

FIG. 14 is a table illustrating performance data for an exemplary solid state lighting apparatus in some embodiments according to the invention.

FIG. 15 is a table illustrating performance data for an exemplary solid state lighting apparatus in some embodiments according to the invention.

DETAILED DESCRIPTION OF EMBODIMENTS ACCORDING TO THE INVENTION

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing ac incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting apparatus according to the present inventive subject matter, wherein the lighting apparatus illuminates at least a portion of the enclosed space (uniformly or non-uniformly).

Figure 1:
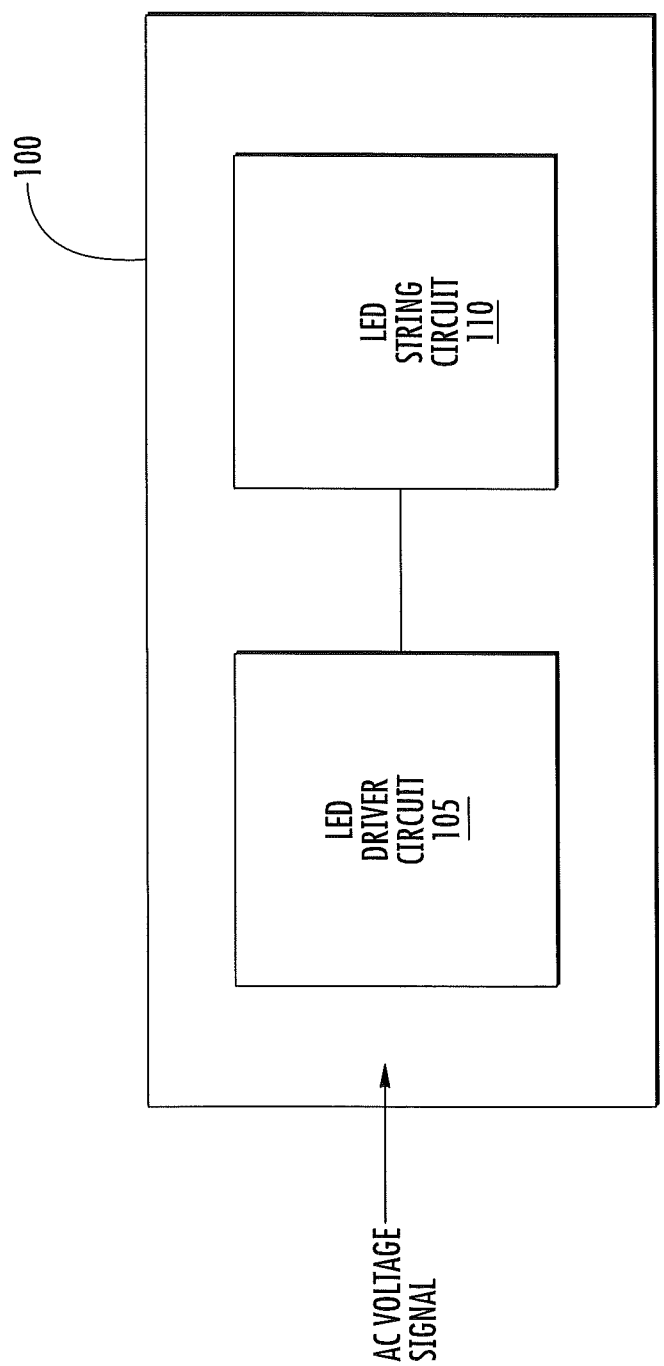
FIG. 1 is a schematic block diagram illustrating a solid state lighting apparatus including a Light Emitting Diode (LED) driver circuit and an LED string circuit in some embodiments according to the invention.

FIG. 1 is a schematic block diagram illustrating a solid state lighting apparatus 101 in some embodiments according to the invention. According to FIG. 1, the solid state lighting apparatus 101 includes a light emitting diode (LED) driver circuit 105 coupled to an LED string circuit 110, both of which are mounted on a surface of a substrate 100. The LED driver circuit 105 is coupled to an ac voltage, which can provide current and voltage to the LED string circuit 110, and other circuits included in the apparatus 101, to emit light from the solid state lighting apparatus 101.

Figure 16:
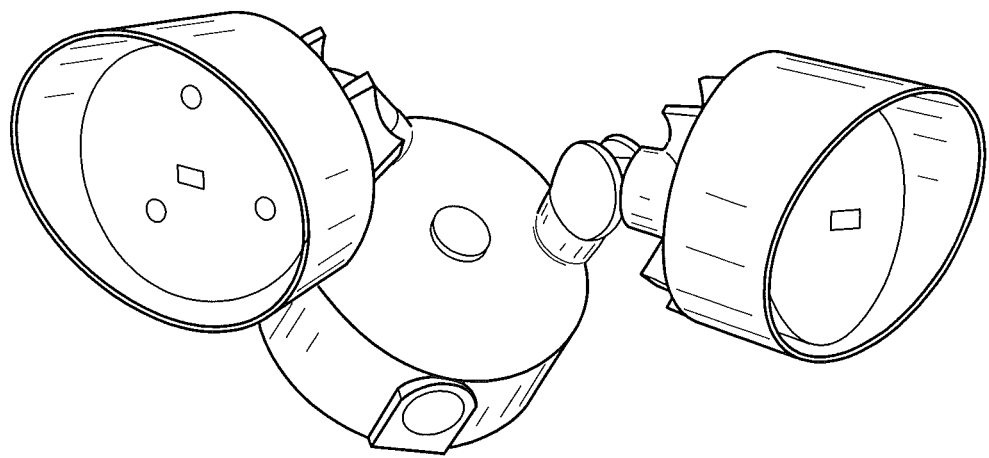
FIG. 16 is an exemplary solid state lighting apparatus housed in a lighting fixture in some embodiments according to the invention.

It will be appreciated that the embodiments illustrated herein can make use of the direct application of ac voltage to the apparatus 101 (from an outside power source) without the inclusion of an "on-board" switched mode. The LED driver circuit 105 can, instead, provide a rectified ac voltage to the LED string circuit 110 to provide acceptable light from the apparatus in some embodiments according to the invention, based on the ac voltage signal provided directly to the solid state lighting apparatus 101. It will further be appreciated that the solid state lighting apparatus 101 according to the invention can be utilized in any format lighting fixture, such as that illustrated in FIG. 16.

The LED driver circuit 105 can include components used to rectify the ac voltage, components to provide a current source to the LED string circuit 110, components for current diversion circuits, components for current limiting circuits (to limit the amount of current passing through at least one of the LEDs in the LED string circuit 110), and at least one energy storage device, such as a capacitor. It will be further understood that, in some embodiments according to the invention, at least some of these components can be mounted on the substrate 100 as discrete electronic component packages. Still further, in some embodiments according to the invention, some of the remaining circuits described herein can be integrated into a single integrated circuit package mounted on the substrate 100.

The LED string circuit 110 can include a plurality of "chip-on-board" (COB) LEDs sets, coupled in series with one another, that are mounted on the substrate 100. Accordingly, the chip-on-board LEDs can be mounted on the substrate 100 without additional packaging which otherwise would be included if those LEDs were to be used in other applications where, for example, the LED is provided on a sub-mount, an intervening substrate, or other chip carrier to which the LED is mounted etc. Such other approaches are described, for example, in commonly assigned pending U.S. application Ser. No. 13/192,755, where for example, LEDs can be located on a submount, located on a lower substrate to provide a stacked arrangement.

It will also be understood that the LED string circuit 110 can make use of packaged LED devices in the place of the COB LEDs, in some embodiments according to the invention. For example, in some embodiments according to the invention, the LED string circuit 110 can include XML-HV LEDs available from Cree, Inc. of Durham N.C.

Accordingly, the apparatus 101 can take the form of a relatively small form factor board, which is coupled directly to the ac voltage signal and provides the rectified ac voltage signal to the string circuit 110, without the use of an on-board switched mode power supply. Further, the string circuit 110 can be made up of COB LEDs or LED devices on the board.

The substrate 100 can be provided in any relatively small form factor (symmetrical or asymmetrical), such as those described herein in reference to FIGS. 4D, 4E, and 5A-5C. Further, the resulting small board with COB LEDs or LED devices included thereon operated by the direct application of the ac voltage signal (but without the on-board switched mode power supply) can provide a small packaged, efficient output lighting apparatus 101 that can perform as detailed in, for example, the tables shown in FIGS. 14 and 15, in some embodiments according to the invention.

It will be understood that the term "mounted on" as used herein includes configurations where the component (such as a chip-on-board LED) is physically connected to the substrate 100 without the use of intervening submounts, substrates, carriers, or other surfaces such as those described in the above-referenced commonly assigned U.S. application Ser. No. 13/192,755. Accordingly, components that are described as being "mounted on" a substrate can be on the same surface of a substrate, or on opposing surfaces of the same substrate. For example, components that are placed and soldered on the same substrate during assembly can be described as being "mounted on" that substrate.

It will be understood that the ac voltage signal can have any magnitude that is sufficient to operate the apparatus 101 in some embodiments according to the invention. For example, in some embodiments according to the invention, the ac voltage signal can be 90 volts ac, 110 volts ac, 220 volts ac, 230 volts ac, 277 volts ac, or any intermediate voltage. In some embodiments according to the invention, the ac voltage signal is provided from a single phase ac voltage signal. In some embodiments according to the invention, however, the ac voltage signal can provided via voltage signals from two leads of a three phase ac voltage signal. Accordingly, the ac voltage signal can be provided from higher voltage ac voltage signals, regardless of the phase. For example, in some embodiments according to the invention, the ac voltage signal can be provided from a three phase 600 volt ac signal. In still further embodiments according to the invention, the ac voltage signal can be a relatively low voltage signal, such as 12 volts ac.

Figure 2:
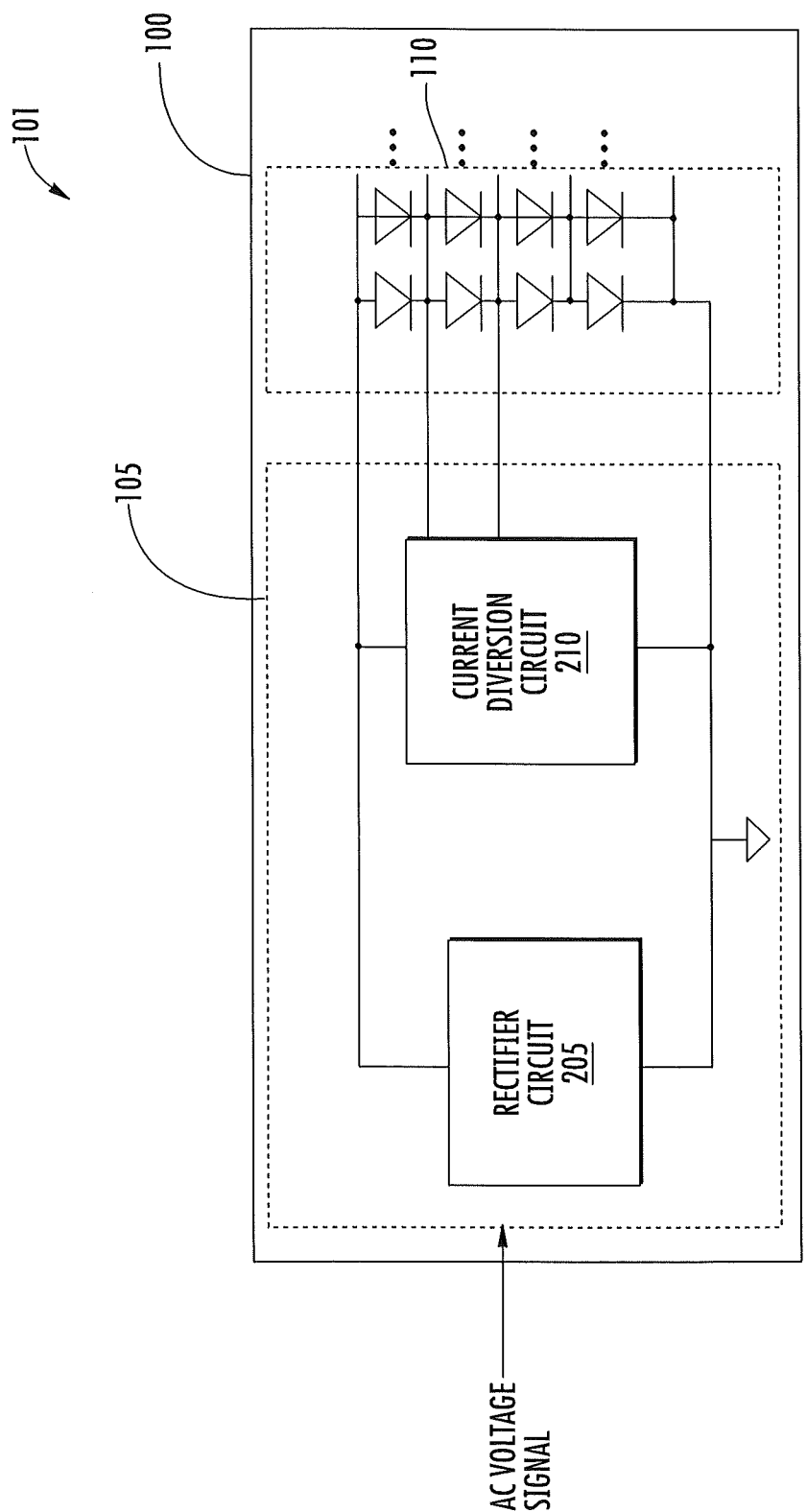
FIG. 2 is a schematic block diagram illustrating the LED driver circuit including a rectifier circuit and a current diversion circuit as shown in FIG. 1, and the LED string circuit coupled thereto in some embodiments according to the invention.

FIG. 2 is a schematic block diagram illustrating a solid state lighting apparatus 101 shown in FIG. 1 in some embodiments according to the invention. According to FIG. 2, the LED driver circuit 105 includes a rectifier circuit 205 coupled to a current diversion circuit 210 and to the LED string circuit 110 that includes a plurality of LED string sets coupled in series with one another. As further shown in FIG. 2, the current diversion circuit 210 is coupled to selected nodes between ones of the LED sets in the string 110.

The current diversion circuit 210 can be configured to operate responsive to the bias state transitions of those respective LED sets across which the current diversion circuit 210 is coupled. Accordingly, in some embodiments according to the invention, LED sets within the string can be incrementally activated and deactivated responsive to the bias states of the devices in the sets. For example, certain ones of the current diversion circuits can be activated and deactivated in response to the forward biasing of LED sets as a rectified ac voltage is applied to the LED string circuit 110. The current diversion circuits can include transistors that are configured to provide respective controllable current diversion paths around the LED sets between the selected nodes to which the current diversion circuit 210 is coupled. These transistors may be turned on/off by the biasing transitions of the LED sets which may be used to affect the biasing of the transistors. Current diversion circuits operating in conjunction with an LED string set are further described, for example, in commonly assigned co-pending U.S. application Ser. No. 13/235,127.

As further shown in FIG. 2, the rectifier circuit 205, the current diversion circuit 210, and the LED string circuit 110 can be mounted on the substrate 100 such that each of these components is provided on a single surface of the substrate 100. In other embodiments according to the invention, some of the circuits described herein are mounted on a first side of the substrate 100, whereas the remaining circuits are mounted on the opposing side of the substrate 100. In some embodiments according to the invention, however, the circuits described herein are mounted on the substrate 100 without the use of intervening substrates, sub-mounts, carriers, or other types of surfaces which are sometimes used to provide stacked types of assemblies in conventional arrangements.

In some embodiments according to the invention, at least some of the components described in reference to FIG. 2 can be mounted on the substrate 100 as discrete electronic component packages. Still further, in some embodiments according to the invention, some of the remaining circuits described in reference to FIG. 2 can be integrated into a single integrated circuit package mounted on the substrate 100.

Still referring to FIG. 2, exemplary solid state lighting apparatus 101 were constructed and operated according to the parameters illustrated in the table of FIG. 14. In particular, the apparatus 101 made use of the current diversion circuits coupled to the string circuit 110 as shown in FIG. 13, without use of the current limiter circuit and capacitor shown in FIG. 13. The apparatus included 12 high voltage 16 junction COB LEDs, which each measured about 1.4 mm×1.4 mm×0.170 mm. The data in the table of FIG. 14 shows that the exemplary boards provided a lumens (Lm) range from about 704 Lm to about 816 Lm, over an efficacy (lumens per watt) range from between about 71 Lm/W to about 79 Lm/W, providing acceptable color points and relatively high power factors. It will be understood in some embodiments according to the invention, however, that greater output may be achieved by, for example, increasing the number of COB LEDs on the board or by increasing the current level used to drive the COB LEDs.

Figure 3:
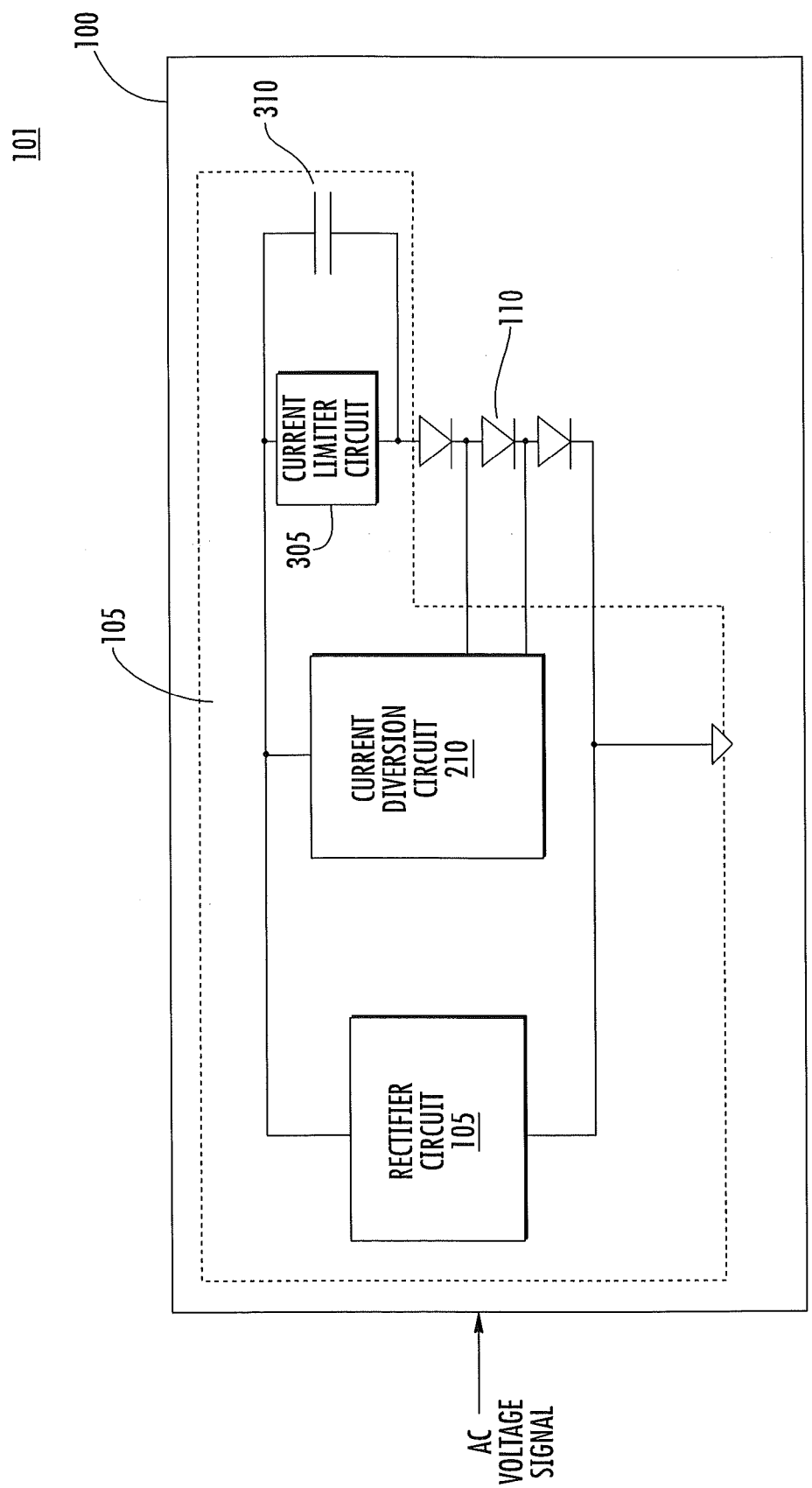
FIG. 3 is a schematic block diagram illustrating the LED driver circuit shown in FIGS. 1 and 2 further including a current limiter circuit and a capacitor coupled to the LED string circuit in some embodiments according to the invention.

FIG. 3 is a schematic block diagram illustrating the solid state lighting apparatus 101 including the LED driver circuit 105 (including the rectifier circuit 205 and current diversion circuit 210) coupled to a current limiter circuit 305 which is connected in parallel to a capacitor 310, both of which are coupled in series with the LED string circuit 110, all of which can be mounted on the surface of the substrate 100.

It will be understood that the current limiter circuit 305 and the capacitor 310 may be utilized to reduce flicker which may otherwise result from the ac voltage provided to the solid state lighting apparatus 101. For example, the capacitor 310 may be used to store energy near peak voltage and use that stored energy to drive the LED string 110 when the ac voltage magnitude is less than what may be required to forward bias the LEDs in the string 110. Still further, the current limiter circuit 305 can be configured to direct current to capacitor 310 so that energy is stored therein or configured to discharge the charge in the capacitor 310 through the LED string 110.

Although FIG. 3 shows that the capacitor 310 is used to store and deliver energy, it will be understood that, any type of electronic energy storage device can be used as alternatives to or, in combination with, the capacitor 310, such as inductors. It will be understood that the use of current limiter circuits in conjunction with LED string circuits is further described, for example, in commonly assigned co-pending U.S. application Ser. No. 13/235,103.

In some embodiments according to the invention, the components shown in FIG. 3 can be mounted on the same surface of the substrate 100. In other embodiments according to the invention, some of the circuits shown in FIG. 3 can be mounted on a first surface of the substrate 100 whereas the remaining circuits are mounted on a second, opposing surface of the substrate 100. In some embodiments according to the invention, the LEDs included in the LED string circuit 110 can be chip-on-board LEDs which may be mounted on either surface of the substrate 100 or on a sub-mount or other substrate which is coupled to the substrate 100 as described, for example, in commonly assigned co-pending U.S. application Ser. No. 13/192,755.

Still referring to FIG. 3, exemplary solid state lighting apparatus 101 were constructed to provide the data illustrated in the table of FIG. 15. In particular, the apparatus 101 made use of the current diversion circuits coupled to the string circuit 110 as shown in FIG. 13, along with the use of the current limiter circuit and capacitor shown in FIG. 13. The apparatus included 12 high voltage 16-junction COB LEDs, which each measured about 1.4 mm×1.4 mm×0.170 mm. The data in the table of FIG. 15 shows that the exemplary boards provided a Lm range from about 674 Lm to about 785 Lm, over an efficacy range from between about 69 Lm/W to about 74 Lm/W, providing acceptable color points and relatively high power factors. It will be understood in some embodiments according to the invention, however, that greater output may be achieved by, for example, increasing the number of COB LEDs on the board or by increasing the current level used to drive the COB LEDs.

Figure 4B:
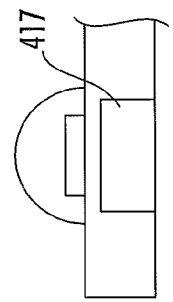
FIG. 4B is a cross-sectional view of the exemplary circuit substrate shown in FIG. 4A, in some embodiments according to the invention.
Figure 4C:
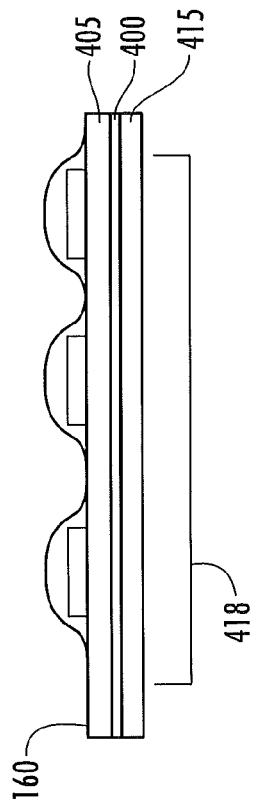
FIG. 4C is an alternative cross-sectional view of an LED string circuit portion of the exemplary circuit substrate shown in FIGS. 4A and 4B including a flexible circuit substrate in some embodiments according to the invention.
Figure 4A:
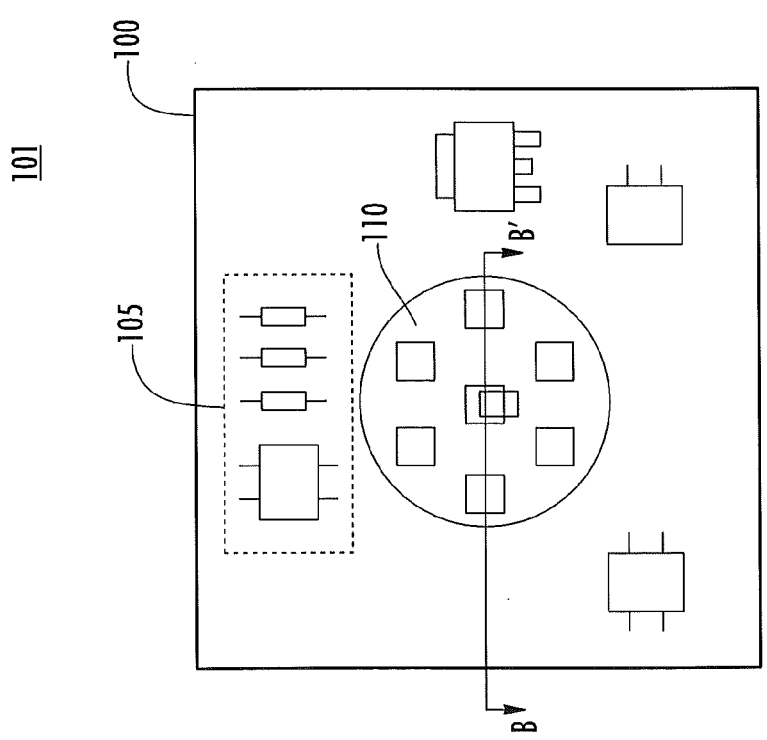
FIG. 4A is a plan view of an exemplary circuit substrate including a rectifier circuit, an LED string circuit and other discrete electronic component packages thereon in the solid state lighting apparatus in some embodiments according to the invention.

FIG. 4A is a plan view illustrating the solid state lighting apparatus 101 including the substrate 100 including the LED driver circuit 105 and the LED string circuit 110 mounted on the surface thereof in some embodiments according to the invention. FIG. 4B is a cross-sectional view of a portion of the solid state lighting apparatus 101 shown in FIG. 4A in some embodiments according to the invention. FIG. 4C is a cross-sectional alternative view of a portion of the solid state lighting apparatus 101 where the substrate 100 includes a thermally conductive slug 417 embedded therein opposite the LED string circuit 110 in some embodiments according to the invention.

According to FIG. 4A, in some embodiments according to the invention, the substrate 100 can be a printed circuit board (PCB). The PCB can be formed of many different materials that can be arranged to provide the desired electrical isolation and high thermal conductivity. In some embodiments, the PCB can at least partially comprise a dielectric to provide the desired electrical isolation. In other embodiments according to the invention, the PCB can comprise ceramic such as alumina, aluminum nitride, silicon carbide, or a polymeric material such as polyimide and polyester etc.

For boards made of materials such a polyimides and polyesters, the boards can be flexible (sometimes referred to as a flexible printed circuit board). This can allow the board to take a non-planar or curved shape, with the LED chips also being arranged in a non-planar manner. In some embodiments according to the invention, the board can be a flexible printed substrate such as a Kapton® polyimide available from Dupont. In some embodiments according to the invention, the board can be a standard FR-4 PCB.

This can assist in providing boards that emit the different light patterns, with the non-planar shape allowing for a less directional emission pattern. In some embodiments according to the invention, this arrangement can allow for more omnidirectional emission, such as in the 0-180° emission angles. In some embodiments according to the invention, the PCB can comprise highly reflective material, such as reflective ceramic or metal layers like silver, to enhance light extraction from the component.

In some embodiments, the board can include a dielectric layer 50 to provide electrical isolation, while also comprising electrically neutral materials that provide good thermal conductivity. Different dielectric materials can be used for the dielectric layer including epoxy based dielectrics, with different electrically neutral, thermally conductive materials dispersed within it. Many different materials can be used, including but not limited to alumina, aluminum nitride (AlN) boron nitride, diamond, etc. Different dielectric layers according to the present invention can provide different levels of electrical isolation with some embodiments providing electrical isolation to breakdown in the range of 100 to 5000 volts. In some embodiments, the dielectric layer can provide electrical isolation in the range of 1000 to 3000 volts. In still other embodiments, the dielectric layer can provide electrical isolation of approximately 2000 volts breakdown. In some embodiments according to the invention, the dielectric layer can provide different levels of thermal conductivity, with some having a thermal conductivity in the range of 1-40 w/m/k. In some embodiments, the dielectric layer can have a thermal conductivity greater than 10 w/m/k. In still other embodiments, the dielectric layer can have a thermal conductivity of approximately 3.5 W/m-k The dielectric layer can have many different thicknesses to provide the desired electrical isolation and thermal conductivity characteristics, such as in the range of 10 to 100 micro meters (μm). In other embodiments, the dielectric layer can have a thickness in the range of 20 to 50 (μm). In still other embodiments, the dielectric layer can have a thickness of approximately 35 (μm).

In some embodiments according to the invention, the substrate 100 can be a metal core PCB, such as a "Thermal-Clad" (T-Clad) insulated substrate material, available from The Bergquist Company of Chanhassen, Minn. The "Thermal Clad" substrate may reduce thermal impedance and conduct heat more efficiently than standard circuit boards. The MCPCB can also include a base plate on the dielectric layer, opposite the LED string circuit 110, and can comprise a thermally conductive material to assist in heat spreading. The base plate can comprise different material such as copper, aluminum or aluminum nitride. The base plate can have different thicknesses, such an in the range of 100 to 2000 μm, while other embodiments can have a thickness in the range of 200 to 1000 μm. Some embodiments can have thickness of approximately 500 μm.

Such substrates may be mechanically robust compared to thick-film ceramics and direct bond copper arrangements. Accordingly, the metal core printed circuit board can be effective to transfer heat generated by LEDs included in the LED string circuit 110 away from the solid state lighting apparatus 101. It will be understood, however, that the substrate 100 can be any material which is suitable for the mounting of the LED driver circuit 105 and LED string circuit 110 thereon, which provides for sufficient thermal conduction away from the LED string circuit 110.

In some embodiments, the MCPCB includes a solder mounting layer on the bottom surface of the base plate that is made of materials that make it compatible for mounting directly to a heat sink, such as by solder reflow. These materials can comprise one or more layers of different metals such as nickel, silver, gold, palladium. In some embodiments, the mounting layer can include a layer of nickel and silver, such a nickel having thickness in the range of 2 to 3 μm and silver in the range of 0.1 to 1.0 μm. In some embodiments, the mounting layer can include other layer stacks such as electroless nickel of approximately 5 μm, electroless palladium of approximately 0.25 μm, and immersion gold of approximately 0.15 μm. Direct soldering of the MCPCB to a heat sink can enhance thermal spreading of heat from the board to the heat sink by providing an increased thermal contact area between the two. This can enhance both vertical and horizontal heat transfer. In some embodiments according to the invention, the MCPCBs can provide different levels of thermal characteristics with a junction to backside performance of approximately of approximately 0.4° C./W.

The size of the substrate 100 can vary depending on different factors, such as the size and number of the chip-on-board LED mounted thereon. For example, in some embodiments the substrate can be approximately 33 mm on each side. In some embodiments according to the invention, the components on the substrate can present a height of about 2.5 mm. Other dimensions can also be used for the substrate 100.

It will be understood that the substrate 100 can be utilized in combination with heat sink structures mounted to, or incorporated within, the respective substrate to provide sufficient heat transfer away from the solid state lighting apparatus 101 as shown for example in FIG. 4C. In some embodiments according to the invention, a flexible heat transfer tape, such as GRAFIHX™, available from Graph-Tech, International of Lakewood, Ohio, can be used to attach a heat sink to the substrate 100. The heat sink can be any thermally efficient material sufficient to conduct heat away from the substrate 100. For example, the heat sink can be a metal, such as aluminum. In some embodiments according to the invention, the heat sink is graphite. In some embodiments according to the invention, the heat sink includes reflective surfaces to improve light extraction.

As further shown in FIG. 4A, the solid state lighting apparatus 101 includes the LED driver circuit 105 mounted on the surface thereof along with a plurality of chip-on-board LEDs arranged into a plurality of LED sets coupled in series with one another to provide the LED string circuit 110 (sometimes referred to as an array of COB LEDs). In some embodiments according to the invention, the COB LEDs of the string 110 can be arranged according to a particular pattern in approximately the center of the substrate 100. It will be understood, however, that the COB LEDs can be arranged in any way that is suitable to provide the light output desired from the solid state lighting apparatus 101. For example, the COB LEDs can be arranged in an approximately circular array, a rectangular array, a random array, or a semi-random array. In some embodiments according to the invention, COB LEDs can be mounted onto a single circuitized substrate 100 with the "dead-space" between the COB LEDs being reduced, which may reduce the size of the solid state lighting apparatus 101 or the size allocated to the substrate 100 within the apparatus 101.

In a COB implementation, a microchip or die, such as an LED, is mounted on and electrically interconnected to its final circuit substrate, instead of undergoing traditional assembly or packaging as an individual LED package or integrated circuit. The elimination of conventional device packaging when using COB assemblies can simplify the over-all process of designing and manufacturing, can reduce space requirements, can reduce cost, and can improve performance as a result of the shorter interconnection paths. A COB process can include three primary steps: 1) LED die attach or die mount; 2) wire bonding; and 3) encapsulation of the die and wires. These COB arrangements can also provide the added advantage of allowing for direct mounting and interface with the main apparatus heat sink.

In some embodiments LED array embodiments, each chip in the array can have its own lens formed onto it to facilitate light extraction and emission with the first pass. First pass light extraction/emission refers to light emitted from a particular LED chip passing through the respective lens and the light's first pass from the LED chip to the surface of the primary lens. That is, the light is not reflected back, such as by total internal reflection (TIR), where some of the light can be absorbed. This first pass emission can enhance the emission efficiency of the LED components by reducing LED light that can be absorbed. Some embodiments can comprise a high density of light emitting components while maximizing the light extraction, which can increase the efficiency of the respective solid state lighting apparatus. Some embodiments according to the present invention can be arranged in sub-groups of LED chips within the array, with each sub-group having its own primary lens for improved light extraction. In some embodiments, the lens can be hemispheric, which can further increase light extraction by providing a lens surface that promotes fist pass light emission.

In some embodiments according to the present invention, LED arrays can include LED chips that emit light of the same color or of different colors (e.g. red, green and blue LED chips or subgroups, white LED and red LED chips or subgroups, etc.) Techniques for generating white light from a plurality of discrete light sources to provide desired CRI at the desired color temperature have been developed that utilize different hues from different discrete light sources. Such techniques are described in U.S. Pat. No. 7,213,940, entitled "Lighting Device and Lighting Method", which is hereby incorporated herein by reference.

In some embodiments, a secondary lens or optic may be used in addition to the primary lens or optics, e.g. a larger secondary optic over multiple groups of emitters with primary optics. With each emitter or groups of emitters having their own primary lens or optic, embodiments according to the invention, may exhibit greater scalability to more readily provide for larger arrays of LEDs. In some embodiments according to the present invention, the LED string circuit 100 can include hundreds of COB LEDs.

In some embodiments the LED array can be COB mounted to a substrate 100 having characteristics that provide for improved operation. The substrate 100 can provide electrical isolation characteristics, which allows for board level electrical isolation of the COB LEDs. At the same time the board can have properties that provide an efficient thermal path to spread heat from the COB LEDs. Efficient thermal spreading of heat from the COB LEDs can result in improved LED chip reliability and color consistency. The substrate 100 can also be arranged to allow efficient mounting a primary heat sink. In some embodiments according to the invention, the substrate 100 includes features that allow it to be easily and efficiently mounted to the heat sink using mechanical means. In other embodiments, the circuit board can comprise a material that allows it to be efficiently and reliably soldered to a heat sink, such as through reflow processes.

The present invention can provide LED array arrangements that are scalable, such that some embodiments can have as few as three emitters and others can have as many as 10s or 100s of emitters.

It will be further understood that some of the components in the LED driver circuit 105 can be discrete electronic component packages mounted on the substrate 100 to provide, for example, the plurality of current diversion circuits mounted on the surface of the substrate 100. It will be further understood that other electronic component packages can be provided on the substrate 100 to provide the remainder of the circuits included in the solid state lighting apparatus 101.

According to FIG. 4B, the substrate 100 can be a metal core multi-layered PCB including an upper metal layer used to provide interaction between the electronic component packages on the surface of the substrate 100. A lower metal (or base) layer 415 can be used to promote heat transfer away from the LED string circuit 110 and can be relatively thick compared to the upper metal layer 405. The upper metal layer 405 and the lower metal layer 415 are separated by a thermally conductive dielectric layer 410 that can electrically insulate the upper metal layer 405 from the lower metal layer 415 while still providing a thermal path from the LED string array 110 to the lower metal layer 415.

Accordingly, the lower metal layer 415 can provide a heat sink for the transfer of heat away from the LED string circuit 110. In still further embodiments according to the invention, a secondary heat sink can be attached to a lower surface of the lower metal layer 415 to provide for additional heat transfer away from the LED string circuit 110.

In some embodiments according to the invention, the lower metal layer 415 can be a metal such as aluminum, copper, or beryllium oxide. In some embodiments according to the invention, the thermally conductive dielectric layer 410 can be a filler-matrix composite that acts as a bonding medium as well as a thermal path for heat conduction as well as providing an insulating layer between the upper metal layer 405 and the lower metal layer 415. In some embodiments according to the invention, the thermal conductivity of the thermally conductive dielectric layer 410 can be about 4 to about 16 times greater than conventional FR4 dielectrics.

Although a single (i.e. upper) metal layer 405 is shown in FIG. 4B, other embodiments according to the invention, can be provided where additional signal layers are provided as part of the metal core PCB. For example, in some embodiments according to the invention, additional upper metal layers 405 can be provided within a thicker thermally conductive dielectric layer 410 to provide a two or more layer multi-core printed circuit board in some embodiments according to the invention. In still further embodiments according to the invention, additional thermally conductive dielectric layers can be provided beneath the lower metal layer 415 such that the lower metal layer 415 is within the metal core printed circuit board, rather than on an exposed surface thereof.

According to FIG. 4C, a flexible printed circuit board is provided as the substrate 100 having the LED string circuit 110 mounted thereon. A thermally conductive slug 417 can be embedded within the substrate 100 proximate to the LED string circuit 110 to provide for heat transfer away from the LED string circuit 110. In some embodiments according to the invention, the thermally conductive slug 417 can be a metal such as copper, aluminum or beryllium oxide. Other thermally conductive materials may also be used.

Figure 4D:
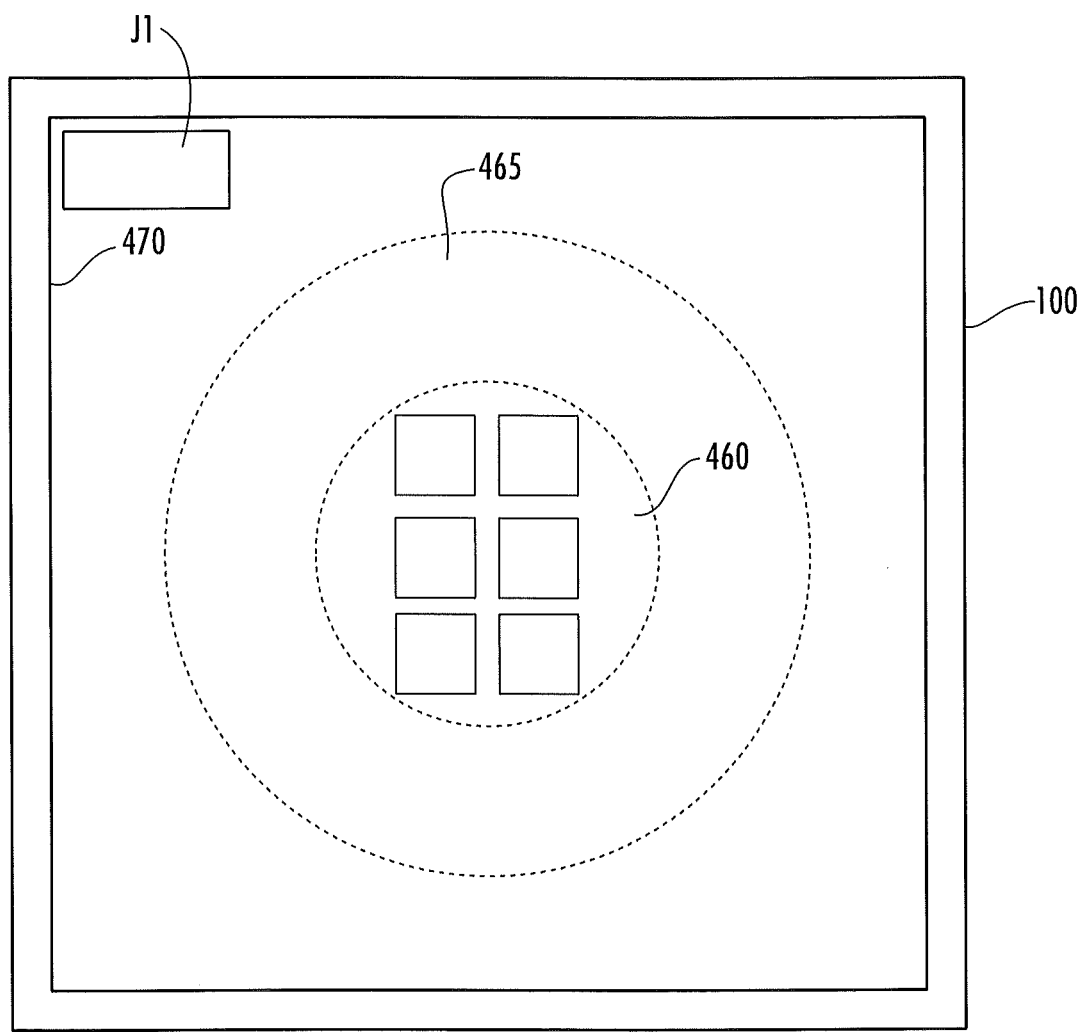
FIG. 4D is a plan view of an exemplary circuit substrate having an approximately symmetrical form-factor in some embodiments according to the invention.

FIG. 4D is a plan view of an exemplary circuit substrate having an approximately symmetrical form-factor in some embodiments according to the invention. According to FIG. 4D, six LEDs (as part of the string circuit 110) are mounted on a central portion 460 of the substrate 100, and an ac voltage source input J1 is mounted on the substrate 100 proximate to the outer edge. As shown in FIG. 4D, the LEDs are in a first arrangement in the central portion 460, according to the desired light output from the apparatus 101. In some embodiments according to the invention, the plurality of LEDs are separated from a remainder of the electronic components mounted to the substrate 100 by a reserved portion 465 of the substrate 100, where the other electronic components are mounted on the substrate 100 only between the reserved portion 465 and outer perimeter 470 of the substrate 100. In some embodiments according to the invention, other electronic components are mounted in the reserved portion 465.

Still referring to FIG. 4D, an exemplary embodiment according to the invention was constructed where the center of the LEDs in the central portion 460 was located at a center of the substrate 100. The apparatus shown generated about 2000 Lumens at about 85 degrees Centigrade, using six XML-HV LEDs available from Cree, Inc. of Durham, N.C. The central portion 460 was about 21 mm in diameter and the overall board size was about 54 mm×60 mm. The reserved portion 465 measured an additional 9.5 mm beyond the central portion 460. The total power provided to the apparatus was about 31.4 W, with about 20.6 W dissipated by the LEDs, at a total power dissipation of 25.2 W for the apparatus 101.

Figure 4E:
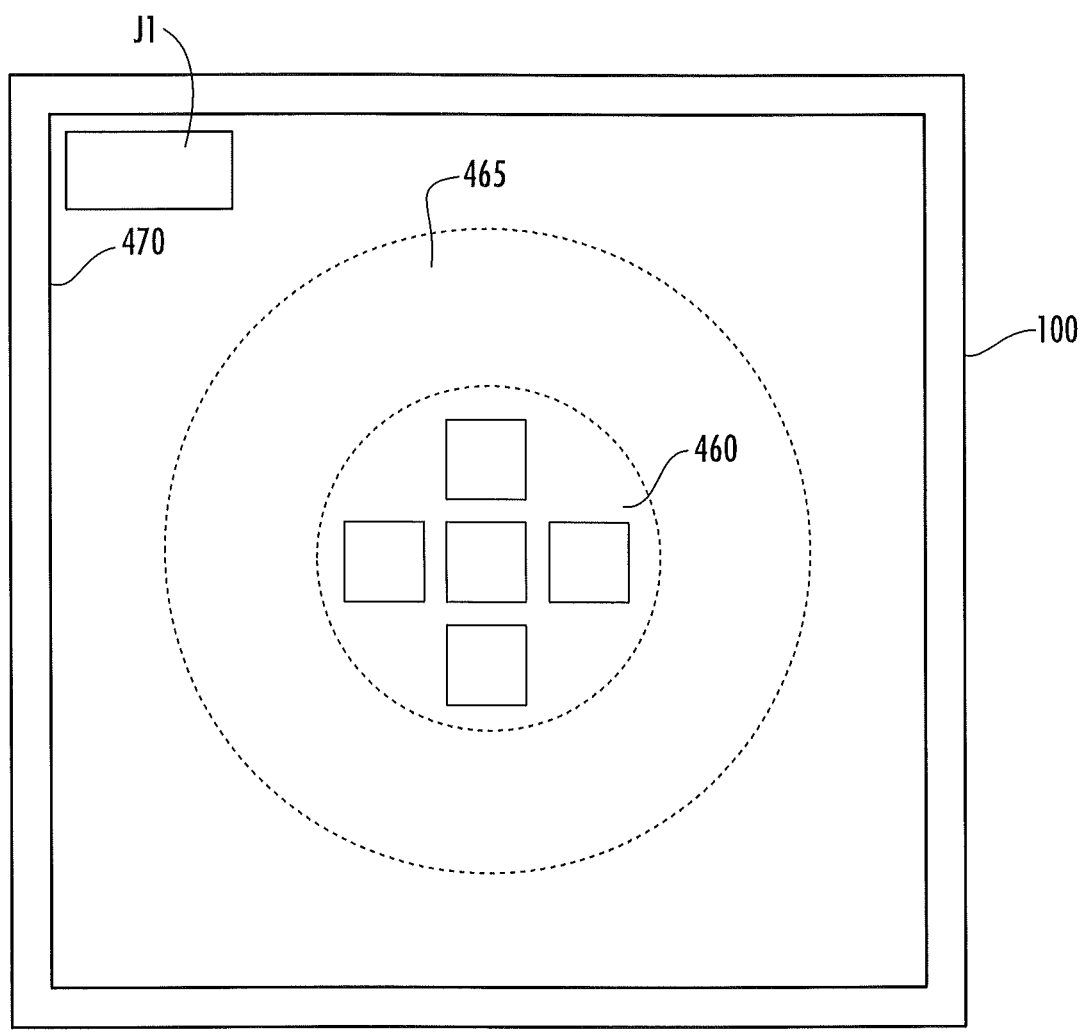
FIG. 4E is a plan view of an exemplary circuit substrate having an approximately symmetrical form-factor in some embodiments according to the invention.

FIG. 4E is a plan view of an exemplary circuit substrate having another approximately symmetrical form-factor in some embodiments according to the invention. According to FIG. 4E, five LEDs (as part of the string circuit 110) are mounted on the central portion 460 of the substrate 100, and an ac voltage source input J1 is mounted on the substrate 100 proximate to the outer edge. As shown in FIG. 4E, the LEDs are in a second arrangement in the central portion 460, according to the desired light output from the apparatus 101. In some embodiments according to the invention, the plurality of LEDs are separated from the remainder of the electronic components mounted to the substrate 100 by the reserved portion 465 of the substrate 100, where the other electronic components are mounted on the substrate 100 only between the reserved portion 465 and outer perimeter 470 of the substrate 100. In some embodiments according to the invention, other electronic components are mounted in the reserved portion 465.

Still referring to FIG. 4E, an exemplary embodiment according to the invention was constructed where the center of the LEDs in the central portion 460 was located at a center of the substrate 100. The apparatus shown generated about 800 Lumens at about 85 degrees Centigrade, using five XTE-HV LEDs available from Cree, Inc. of Durham N.C. The central portion 460 was about 16.1 mm in diameter and the overall board size was about 54 mm×54 mm. The reserved portion 465 measured an additional 9.5 mm beyond the central portion 460. The total power provided to the apparatus was about 13.9 W, with about 9.5 W dissipated by the COB LEDs, at a total power dissipation of 11.5 W for the apparatus 101.

Figure 5A:
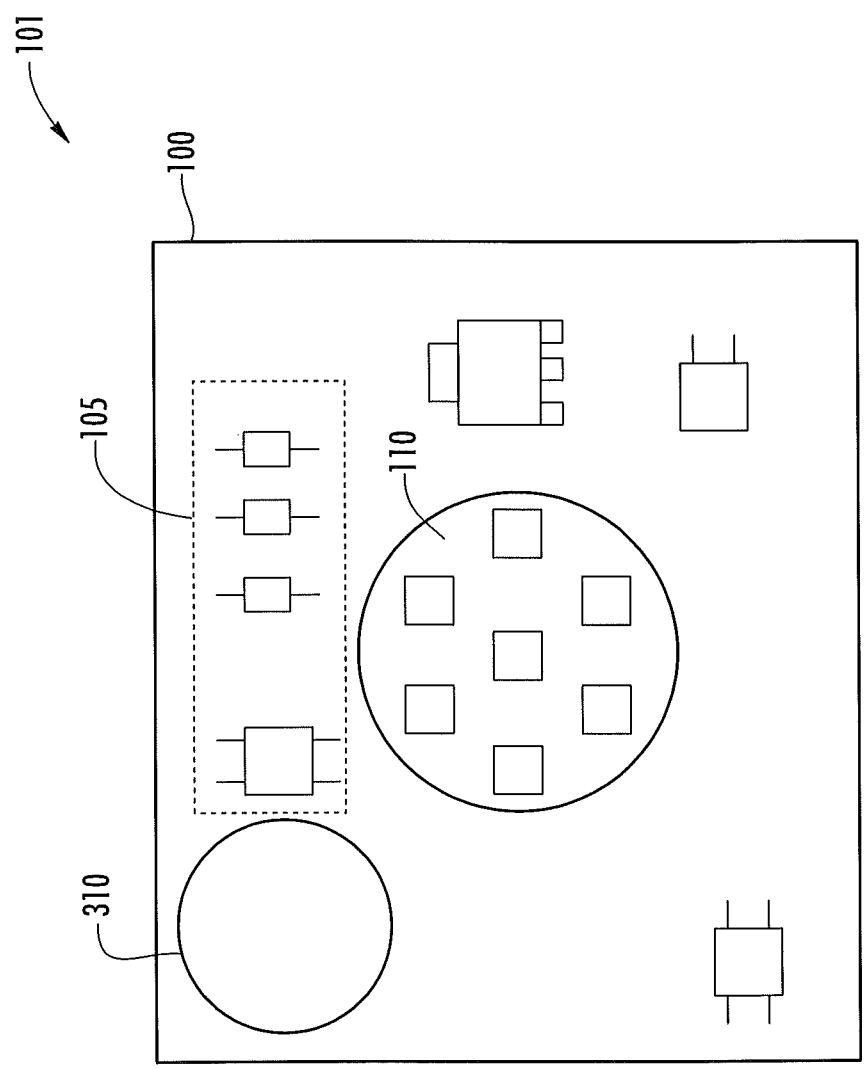
FIG. 5A is a plan view illustrating an exemplary circuit substrate including the rectifier circuit and LED string circuit coupled to a capacitor in some embodiments according to the invention.

FIG. 5A is a plan view illustrating the solid state lighting apparatus 101 including the LED string circuit 110 and the LED driver circuit 105 mounted on the substrate 100 and including the capacitor 310 in some embodiments according to the invention. It will be understood that the LED driver circuit 105 shown in FIG. 5 can also include the plurality of diversion circuits described herein, as well as the current limiter circuit 305 working in conjunction with the capacitor 310 to provide for operation of the LED string circuit 110 as described herein. It will be further understood that the capacitor 310 can be mounted on the substrate to reduce the likelihood that the profile of the capacitor 310 may introduce a shadow into the light emitted by the solid state lighting apparatus 101. Accordingly, the capacitor 310 may be located near an outer perimeter of the substrate 100.

The size of the substrate 100 can vary depending on different factors, such as the size and number of the chip-on-board LED mounted thereon. For example, in some embodiments the substrate can be rectangular being approximately 33 mm×46 mm. In some embodiments according to the invention, the components on the substrate can present a height that is about equal to the height of the capacitor 310. In some embodiments according to the invention, the components on the substrate can present a height that is about equal to 13.5 mm. Other dimensions can also be used for the substrate 100.

Figure 5B:
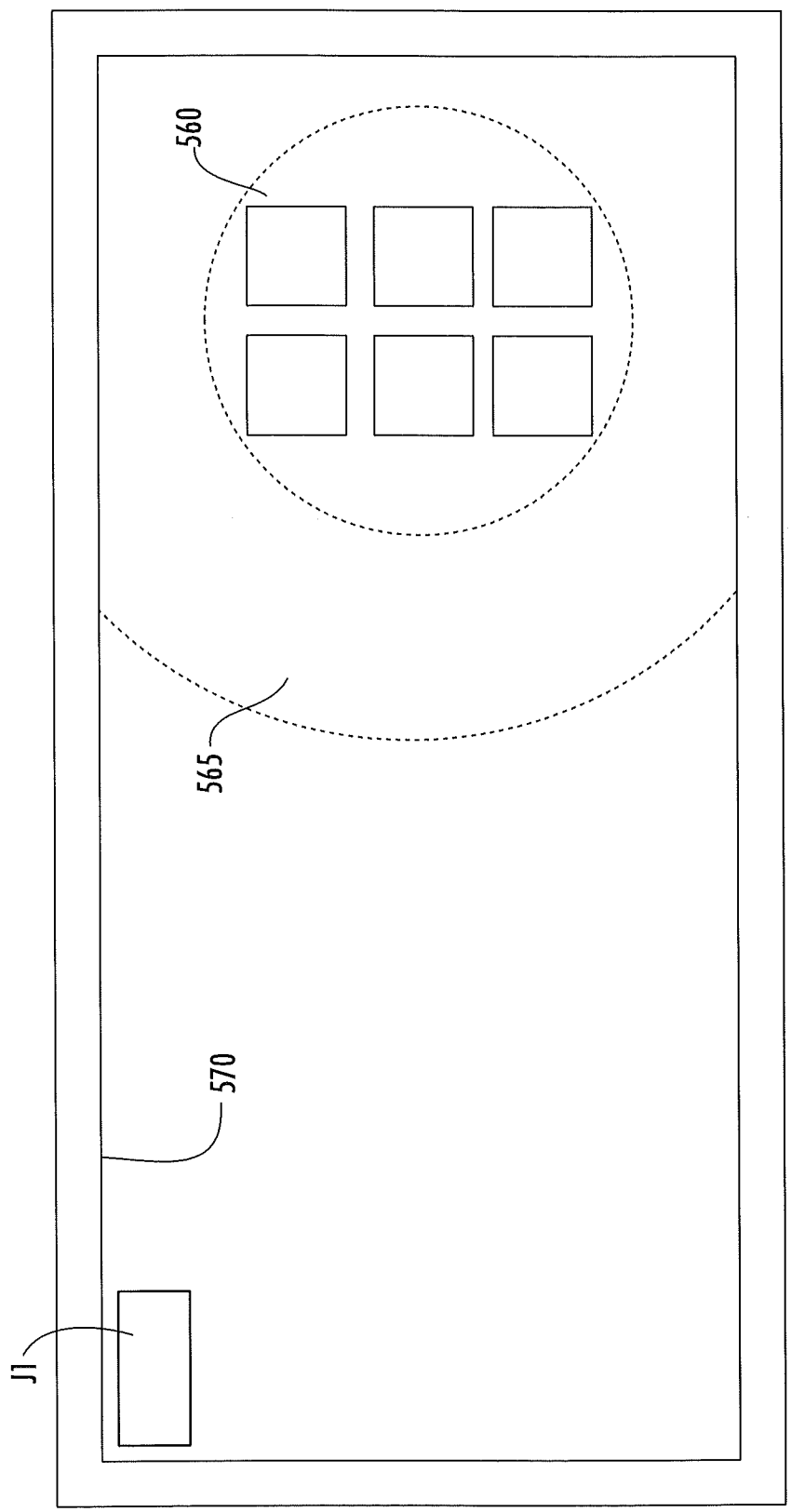
FIG. 5B is a plan view of an exemplary circuit substrate having an approximately asymmetrical form-factor in some embodiments according to the invention.

FIG. 5B is a plan view of an exemplary circuit substrate having an approximately asymmetrical form-factor in some embodiments according to the invention. According to FIG. 5B, six LEDs (as part of the string circuit 110) are mounted on a side portion 560 of the substrate 100. As shown in FIG. 5B, the LEDs are in the first arrangement in the side portion 560, according to the desired light output from the apparatus 101, and an ac voltage source input J1 is mounted on the substrate 100 proximate to the outer edge. In some embodiments according to the invention, the plurality of LEDs are separated from the remainder of the electronic components mounted to the substrate 100 by the reserved portion 565 of the substrate 100, where the other electronic components are mounted on the substrate 100 only between the reserved portion 565 and outer perimeter 570 of the substrate 100. In some embodiments according to the invention, other electronic components are mounted in the reserved portion 565.

Still referring to FIG. 5B, an exemplary embodiment according to the invention was constructed where the center of the LEDs in the central portion 460 was located about 17.5 mm from the top and bottom edges, about 15.2 mm from the right edge, of the substrate 100. The apparatus shown generated about 2000 Lumens at about 85 degrees Centigrade, using six XML-HV LEDs available from Cree, Inc. of Durham N.C. The central portion 560 was about 21 mm in diameter and the overall board size was about 71.3 mm×35 mm. The reserved portion 565 measured an additional 9.5 mm beyond the central portion 560. The total power provided to the apparatus was about 31.4 W, with about 20.6 W dissipated by the LEDs, at a total power dissipation of 252 W for the apparatus 101.

Figure 5C:
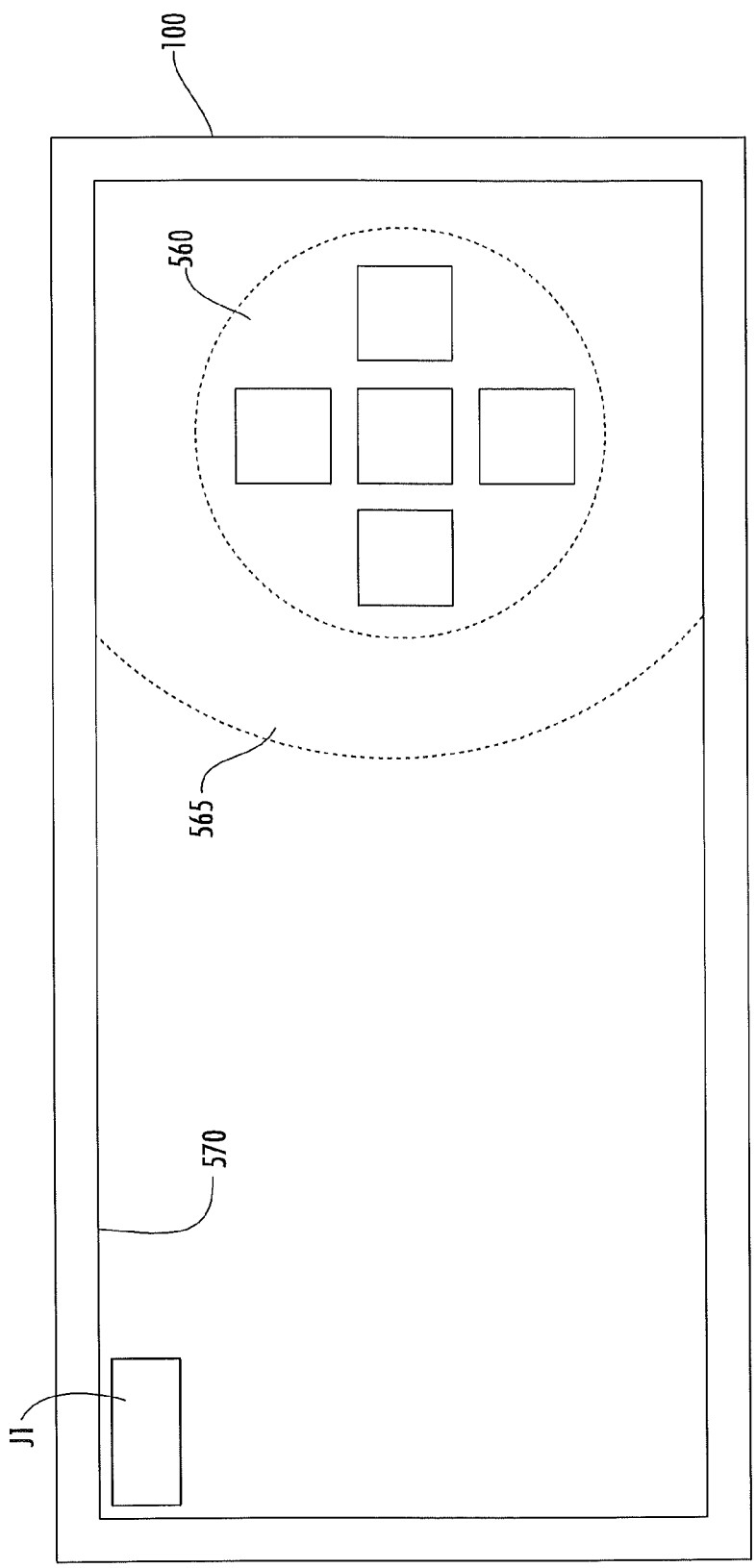
FIG. 5C is a plan view of an exemplary circuit substrate having an approximately asymmetrical form-factor in some embodiments according to the invention.

FIG. 5C is a plan view of an exemplary circuit substrate having an approximately asymmetrical form-factor in some embodiments according to the invention. According to FIG. 5C, five LEDs (as part of the string circuit 110) are mounted on the side portion 560 of the substrate 100. As shown in FIG. 5C, the LEDs are in the second arrangement in the side portion 560, according to the desired light output from the apparatus 101, and an ac voltage source input J1 is mounted on the substrate 100 proximate to the outer edge. In some embodiments according to the invention, the LEDs are separated from the remainder of the electronic components mounted to the substrate 100 by the reserved portion 565 of the substrate 100, where the other electronic components are mounted on the substrate 100 only between the reserved portion 565 and outer perimeter 570 of the substrate 100. In some embodiments according to the invention, other electronic components are mounted in the reserved portion 565.

Still referring to FIG. 5C, an exemplary embodiment according to the invention was constructed where the center of the LEDs in the central portion 560 was located about 16.2 mm from the top and bottom edges, about 12.827 mm from the right edge, of the substrate 100. The apparatus shown generated about 800 Lumens at about 85 degrees Centigrade, using five XTE-HV LEDs available from Cree, Inc. of Durham N.C. The central portion 560 was about 16.1 mm in diameter and the overall board size was about 66.875 mm×32.4 mm. The reserved portion 565 measured an additional 9.5 mm beyond the central portion 560. The total power provided to the apparatus was about 13.9 W, with about 9.5 W dissipated by the LEDs, at a total power dissipation of 11.5 W for the apparatus 101.

Figure 5D:
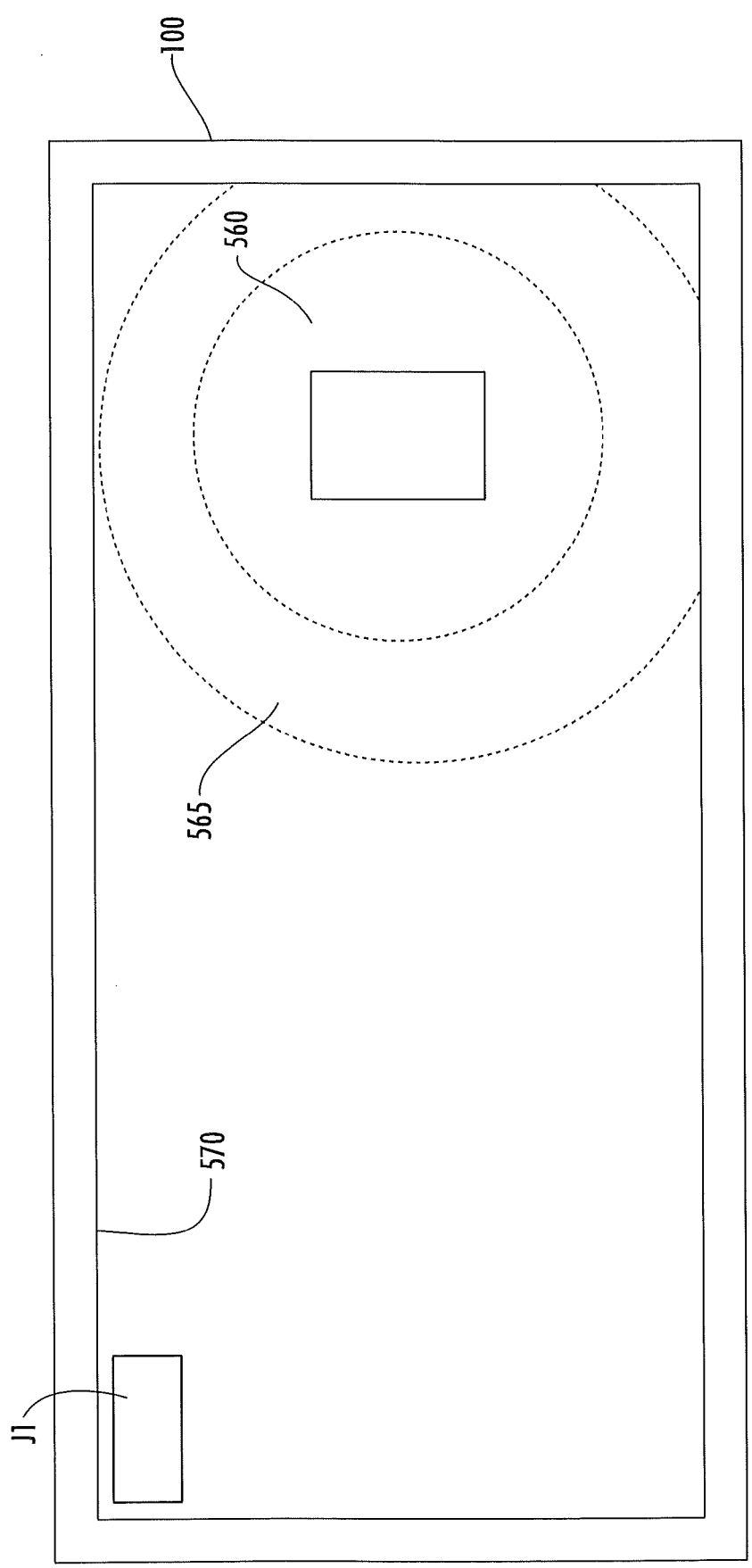
FIG. 5D is a plan view of an exemplary circuit substrate having an approximately asymmetrical form-factor in some embodiments according to the invention.

FIG. 5D is a plan view of an exemplary circuit substrate having an approximately asymmetrical form-factor in some embodiments according to the invention. According to FIG. 5C, a single LED (as part of the string circuit 110) is mounted on the side portion 560 of the substrate 100. The single LED is arranged in the side portion 560, according to the desired light output from the apparatus 101, and an ac voltage source input J1 is mounted on the substrate 100 proximate to the outer edge. In some embodiments according to the invention, the LED is separated from the remainder of the electronic components mounted to the substrate 100 by the reserved portion 565 of the substrate 100, where the other electronic components are mounted on the substrate 100 only between the reserved portion 565 and outer perimeter 570 of the substrate 100. In some embodiments according to the invention, other electronic components are mounted in the reserved portion 565.

In view of the above descriptions in reference to FIGS. 4-5, it will be understood that a wide range of light output can be provided by varying the number, types, and arrangement of the LEDs (or COB LEDs according to the particular embodiment) in some embodiments according to the invention. For example, other embodiments can be provided to generate 600 Lumen using 4 XTE-HV LEDs (and the current to drive the LEDs). In some embodiments according to the invention, 1000 Lumen may be generated using 3 XML-HV LEDs. Other combinations of Lumens and the number and type of COB LEDs may also be used to provide embodiments according to the invention.

Accordingly, embodiments according to the invention can provide relatively small substrates that do not include an onboard switched mode power supply, but emit relatively high levels of light. For example, in some embodiments according to the invention, a substrate can occupy an area of about 3240 mm$^2$ or less while emitting at least 2000 lumens. Further, in some embodiments according to the invention, a portion of the substrate utilized by the LEDs (or COB LEDs) can be about 1384 mm$^2$ or less. In some embodiments according to the invention, the LEDs (or COB LEDs) can utilize about 40% or less of the entire area of the substrate. In some embodiments according to the invention, the reserve portions adjacent to the portions of the substrate utilized by the LEDs (or COB LEDs) can be about 16% or more of the length of the largest dimension of the substrate (i.e., length or width).

In further embodiments according to the invention, a substrate can occupy an area of about 2900 mm$^2$ or less while emitting at least 800 lumens. Further, in some embodiments according to the invention, a portion of the substrate utilized by the LEDs (or COB LEDs) can be about 814 mm$^2$ or less. In some embodiments according to the invention, the LEDs (or COB LEDs) can utilize about 30% or less of the entire area of the substrate. In some embodiments according to the invention, the reserve portions adjacent to the portions of the substrate utilized by the LEDs (or COB LEDs) can be about 18% or more of the length of the largest dimension of the substrate (i.e., length or width).

In further embodiments according to the invention, a substrate can occupy an area of about 3240 mm$^2$ or less while emitting at least 2000 lumens. Further, in some embodiments according to the invention, a portion of the substrate utilized by the LEDs (or COB LEDs) can be about 1384 mm$^2$ or less. In some embodiments according to the invention, the LEDs (or COB LEDs) can utilize about 40% or less of the entire area of the substrate. In some embodiments according to the invention, the reserve portions adjacent to the portions of the substrate utilized by the LEDs (or COB LEDs) can be about 13% or more of the length of the largest dimension of the substrate (i.e., length or width).

In further embodiments according to the invention, a substrate can occupy an area of about 2144 mm$^2$ or less while emitting at least 800 lumens. Further, in some embodiments according to the invention, a portion of the substrate utilized by the LEDs (or COB LEDs) can be about 814 mm$^2$ or less. In some embodiments according to the invention, the LEDs (or COB LEDs) can utilize about 38% or less of the entire area of the substrate. In some embodiments according to the invention, the reserve portions adjacent to the portions of the substrate utilized by the LEDs (or COB LEDs) can be about 14% or more of the length of the largest dimension of the substrate (i.e., length or width).

Figure 5E:
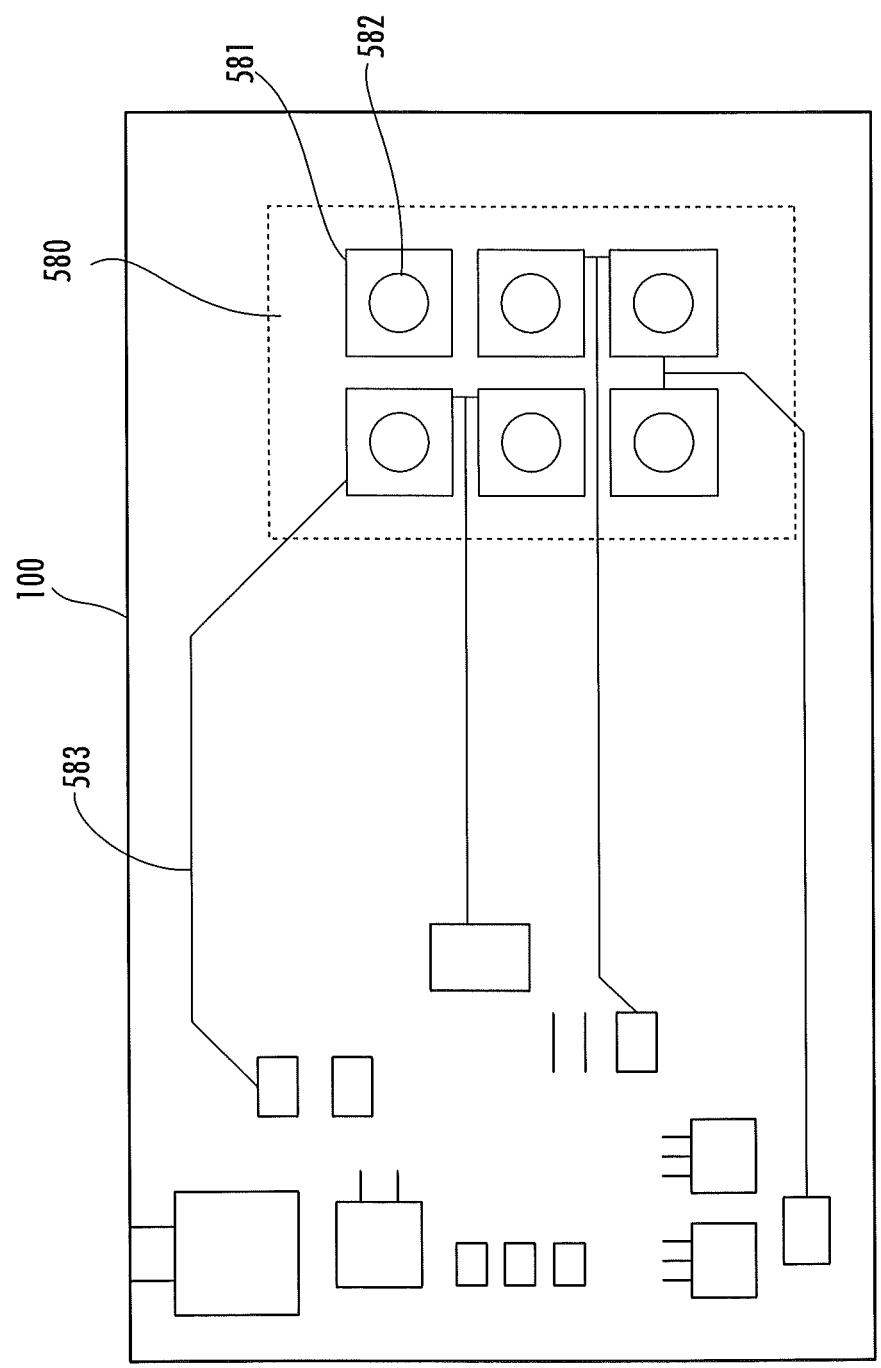
FIG. 5E is a plan view of an exemplary circuit substrate having an approximately asymmetrical form-factor in some embodiments according to the invention.

FIG. 5E is a plan view of an exemplary circuit substrate having an approximately asymmetrical form-factor in some embodiments according to the invention. According to FIG. 5E, six LEDs devices (as part of the string circuit 110) are mounted on a side portion 580 of the substrate 100. The LEDs devices can be those available from Cree, Inc. of Durham N.C., which are described in, for example, U.S. patent application Ser. Nos. 13/027,006, filed on Feb. 14, 2011, 13/178,791, filed on Jul. 8, 2011, and 13/112,502, filed on May 20, 2011, the disclosures of which is incorporated herein by reference. As shown in FIG. 5E, the LED devices each include a respective submount 581 and a respective lens 582, in a first arrangement in the side portion 580, according to the desired light output from the apparatus. The LED devices are electrically coupled to the remainder of the electronic components on the substrate 100 by conductive traces 583. In some embodiments according to the invention, the plurality of LEDs devices are separated from the remainder of the electronic components by a reserved portion of the substrate 100, where the other electronic components are mounted on the substrate 100 outside the reserve portion of the substrate 100. In some embodiments according to the invention, other electronic components are mounted in the reserved portion.

Figure 5F:
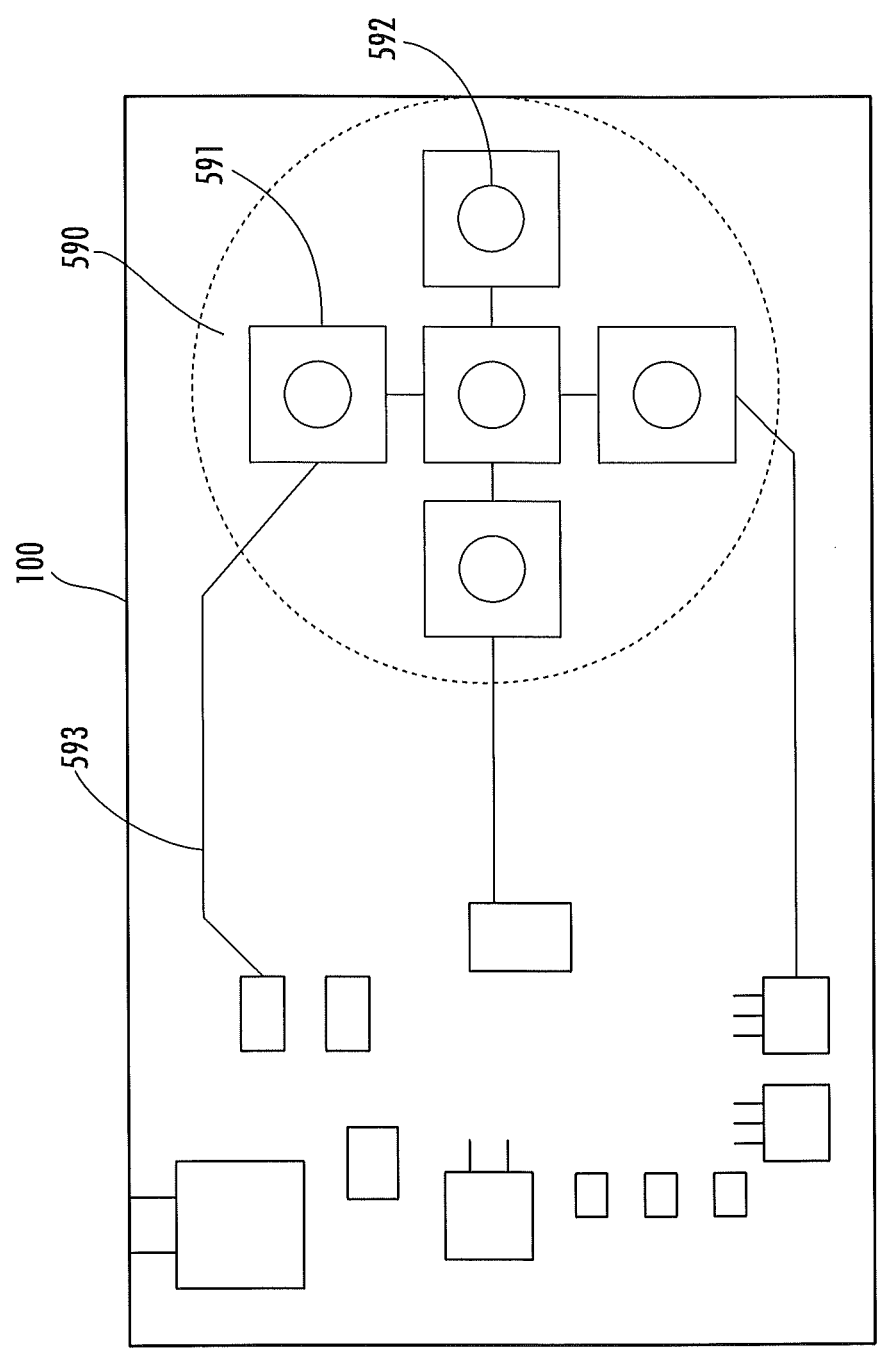
FIG. 5F is a plan view of an exemplary circuit substrate having an approximately asymmetrical form-factor in some embodiments according to the invention.

FIG. 5F is a plan view of an exemplary circuit substrate having an approximately asymmetrical form-factor in some embodiments according to the invention. According to FIG. 5F, five LED devices (as part of the string circuit 110) are mounted on a side portion 590 of the substrate 100. The LEDs devices can be those available from Cree, Inc. of Durham N.C. which are described in, for example, U.S. patent application Ser. Nos. 13/027,006, filed on Feb. 14, 2011, 13/178,791, filed on Jul. 8, 2011, and 13/112,502, filed on May 20, 2011. As shown in FIG. 5F, the LED devices each include a respective submount 591 and a respective lens 592, in the side portion 590, according to the desired light output from the apparatus. The LED devices are electrically coupled to the remainder of the electronic components on the substrate 100 by conductive traces 593. In some embodiments according to the invention, the LED devices are separated from the remainder of the electronic components mounted to the substrate 100 by the reserved portion of the substrate 100, where the other electronic components are mounted on the substrate 100 outside the reserved portion of the substrate 100. In some embodiments according to the invention, other electronic components are mounted in the reserved portion. It will be further understood that the features particularly illustrated in FIGS. 5E and 5F, such as the submounts for the respective LEDs, the conductive traces, and the remainder of the electronic components can also be included in the embodiments of FIGS. 4-5D.

Figure 6:
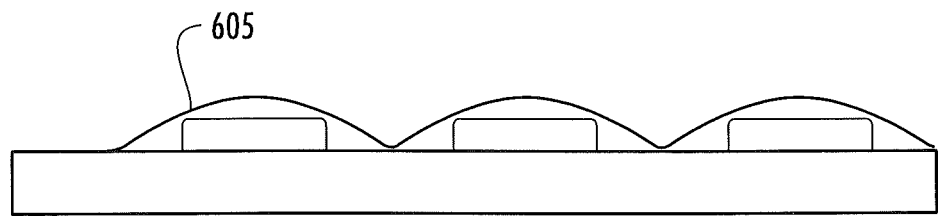
Figure 7:
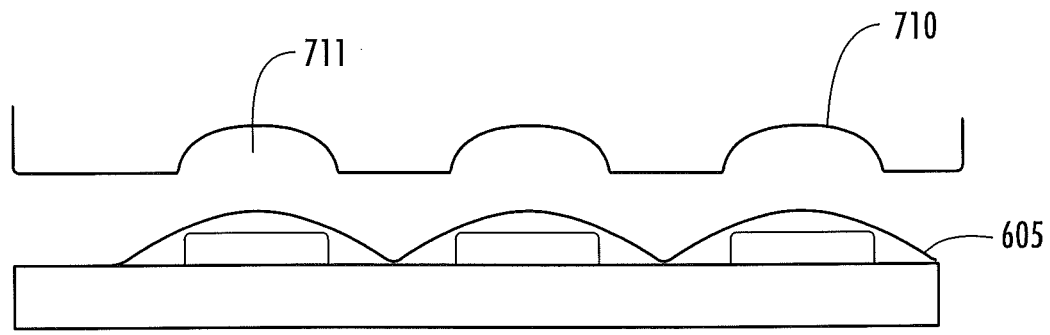
Figure 8:
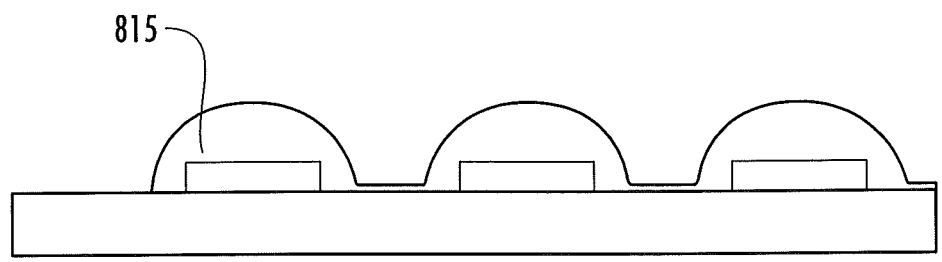

FIGS. 6-8 are cross-sectional views illustrating methods of forming a solid state lighting apparatus in some embodiments according to the invention. According to FIG. 6, chip-on-board LEDs included in the LED string circuit 110 are mounted on the substrate 100. An encapsulate material 605 is applied over the chip-on-board LEDs. In some embodiments according to the invention, the encapsulate material 605 provides a continuous layer that covers the LEDs as well as portions of the substrate 100 between adjacent ones of the LEDs. Accordingly, the encapsulate material 605 may be applied to the chip-on-board LEDs essentially simultaneously with one another.

It will be understood that the encapsulate material 605 can be used to form a lens over the chip-on-board LEDs. In some embodiments according to the invention, the encapsulate material 605 can include liquid silicone and/or liquid epoxy, and/or a volatile solvent material, such as alcohol, water, acetone, methanol, ethanol, ketone, isopropynol, hydrocarbon solvents, hexane, ethylene glycol, methyl ethyl ketone, and combinations thereof.

In still further embodiments according to the invention, the portion of the encapsulate material 605 that extends between adjacent ones of the chip-on-board LEDs may remain on the substrate 100 after completion of the assembly process, whereas in some embodiments according to the invention, the intervening encapsulate material 605 is removed from the substrate 100. In still other embodiments according to the invention, the encapsulate material 605 can include other materials, such as optical conversion materials, diffusion materials and the like.

According to FIG. 7, a mold 710 is brought into contact with the encapsulate material 605 on the chip-on-board LEDs. The mold 710 includes recesses 711 in a lower surface thereof positioned opposite where the chip-on-board LEDs are to be located on the substrate 100. The recessed 711 have a shape that is to be given to the lenses on the chip-on-board LEDs.

The mold 710 can be any material suitable for the molding of an the selected encapsulate material 605 (i.e. such as silicone) into a conformal or other profile layer. In some embodiments according to the invention, the mold 710 can be a metal, such as aluminum. In some embodiments according to the invention, the mold 710 can be Silicon or Silicon Carbide. Other materials can be used as the mold 710

The mold 710 can have a release material applied thereto. In particular, a release material can be sprayed, or otherwise applied onto a surface of the mold 710 from which the substrate and chip-on-board LEDs are separated. The release material can be any material that will promote the removal of the chip-on-board LEDs and the substrate 100 from the mold 710. In some embodiments according to the invention, the release material can be a silicone based release agent.

It will be understood that, even though the encapsulate material 605 extending on the substrate 100 between adjacent ones of the chip-on-board LEDs may be compressed to a relatively thin layer, the encapsulate material 605 can remain on the substrate 100 despite not being provided as part of the lens for a particular chip-on-board LED.

According to FIG. 8, each of the chip-on-board LEDs on the substrate 100 is provided with a lens 815 from the molded encapsulate material 605. In some embodiments according to the invention, the encapsulate material 605 between the adjacent ones of the chip-on-board LEDs shown in FIG. 8 may be removed. It will be further understood that additional layers of encapsulate material 605 may be provided on the lenses 815 to provide additional optical features to the LED string circuit 110. Subsequent to molding the lenses 815, additional discrete electronic component packages may be mounted on the substrate 100. For example, in some embodiments according to the invention, the discrete electronic component packages making up the LED driver circuit 105 can be mounted on to the substrate 100 after the lenses 815 are formed from the encapsulate material 605.

FIG. 9 is a cross-sectional view illustrating methods of forming the solid state lighting apparatus 101 using a mold to form the lenses 815 in some embodiments according to the invention. In particular, the mold 910 further includes discrete electronic component package recesses 911 that are configured to accommodate the profile of the discrete electronic component packages 905 mounted on the substrate 100 that are outside the LED string circuit 110 having the encapsulate material 605 thereon. Accordingly, the discrete electronic component packages 905 can be mounted onto the substrate 100 along with the chip-on-board LEDs in the string circuit 110. The encapsulate material 605 can then be applied to the chip-on-board LEDs whereupon the mold 910 can be brought into contact with the encapsulate material 605 to form the lenses 815 while damage to the discrete electronic component packages 905 may be avoided by the inclusion of the discrete electronic component package recesses 911.

Figure 12:
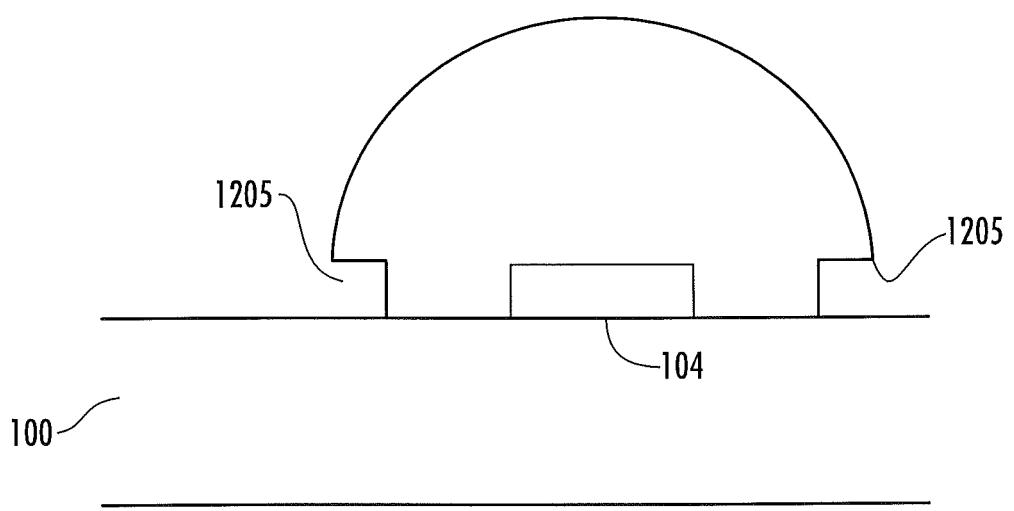

FIGS. 10-12 are cross-sectional views illustrating methods of forming the solid state lighting apparatus 101 in some embodiments according to the invention. According to FIG. 10A, the chip-on-board LEDs are mounted on the substrate 100 and are at least partially surrounded by encapsulate barriers 1005 on the substrate 100. It will be understood that an upper surface of the encapsulate barriers 1005 are lower than the upper surfaces of the chip-on-board LEDs that are surrounded by the encapsulate barriers 1005.

An encapsulate material 1015 is dispensed onto the chip-on-board LEDs. In some embodiments according to the invention, the encapsulate material 1015 is dispensed onto the chip-on-board LEDs using nozzles 1110. The encapsulate material 1015 is dispensed in an amount that is sufficient to provide for the formation of each respective lens 815 over the respective chip-on-board LED. In some embodiments according to the invention, the nozzle 1110 is moved over the chip-on-board LEDs to dispense the encapsulate material 1115 onto each of the respective chip-on-board LEDs according to a sequence. For example, the nozzle 1110 may be located over the leftmost chip-on-board LED in the first position to distribute the encapsulate material 1115 onto the respective chip-on-board LED located just below the nozzle 1110.

After dispensing the encapsulate material 1115, the nozzle 1110 is moved to a second position above the chip-on-board LED that is located immediately to the right of the leftmost chip-on-board LED. This procedure may be repeated to dispense the encapsulate material 1115 onto each of the chip-on-board LEDs included in the string circuit 110. In still other embodiments according to the invention, a plurality of nozzles 1110 are prepositioned over at least two of the chip-on-board LEDs whereupon the encapsulate material 1115 is dispensed on to each of the chip-on-board LEDs essentially simultaneously with one another.

The encapsulate barriers 1005 are configured to restrict the flow of an encapsulate material 1115 onto the respective chip-on-board LED to allow for the formation of the lens 815 to have the desired shape 1105. It will be understood that, as shown in FIG. 10B, for example, the encapsulate barrier 1005 can at least partially surround each of the respective chip-on-board LEDs. For example, in some embodiments according to the invention, the encapsulate barrier 1005 may completely surround the respective chip-on-board LED. In other embodiments according to the invention, the encapsulate barrier 1005 may only partially surround the chip-on-board LED.

In some embodiments according to the invention, the encapsulate barrier 1005 may have periodic or aperiodic gaps formed therein but still allow the formation of the lens 815 having the desired shape 1105 for the chip-on-board LED. It will also be understood that although the encapsulate barrier 1005 is shown as having essentially a rectangular cross-section, other forms of the encapsulate barrier 1005 may be used. For example, the encapsulate barrier 1005 may have a semi-circular shape or other geometric shape that provides adequate surface tension to promote the shape 1105 to the encapsulate material 1115 when dispensed on to the chip-on-board LED.

In some embodiments according to the invention, the encapsulate barrier 1005 may have any shape that restricts the flow of the encapsulate material 1015. For example, in some embodiments according to the invention, the encapsulate barrier 1005 has a square or rectangular perimeter shape to at least partially surround the chip-on-board LEDs. Other shapes can be used.

FIG. 12 is a cross-sectional view showing the removal of the encapsulate barrier 1005 from around the chip-on-board LED 1004 after formation of the lens 815 having a desired profile 1105. In particular, the encapsulate barrier 1005 can be etched from the outer edge of the lens 815 at a base of the chip-on-board LED to form a recess 1205 at an outermost edge of the lens 815 at the surface of the substrate 100. In some embodiments according to the invention, the encapsulate barrier 1005 is not removed from the lens 815.

Figure 13A:
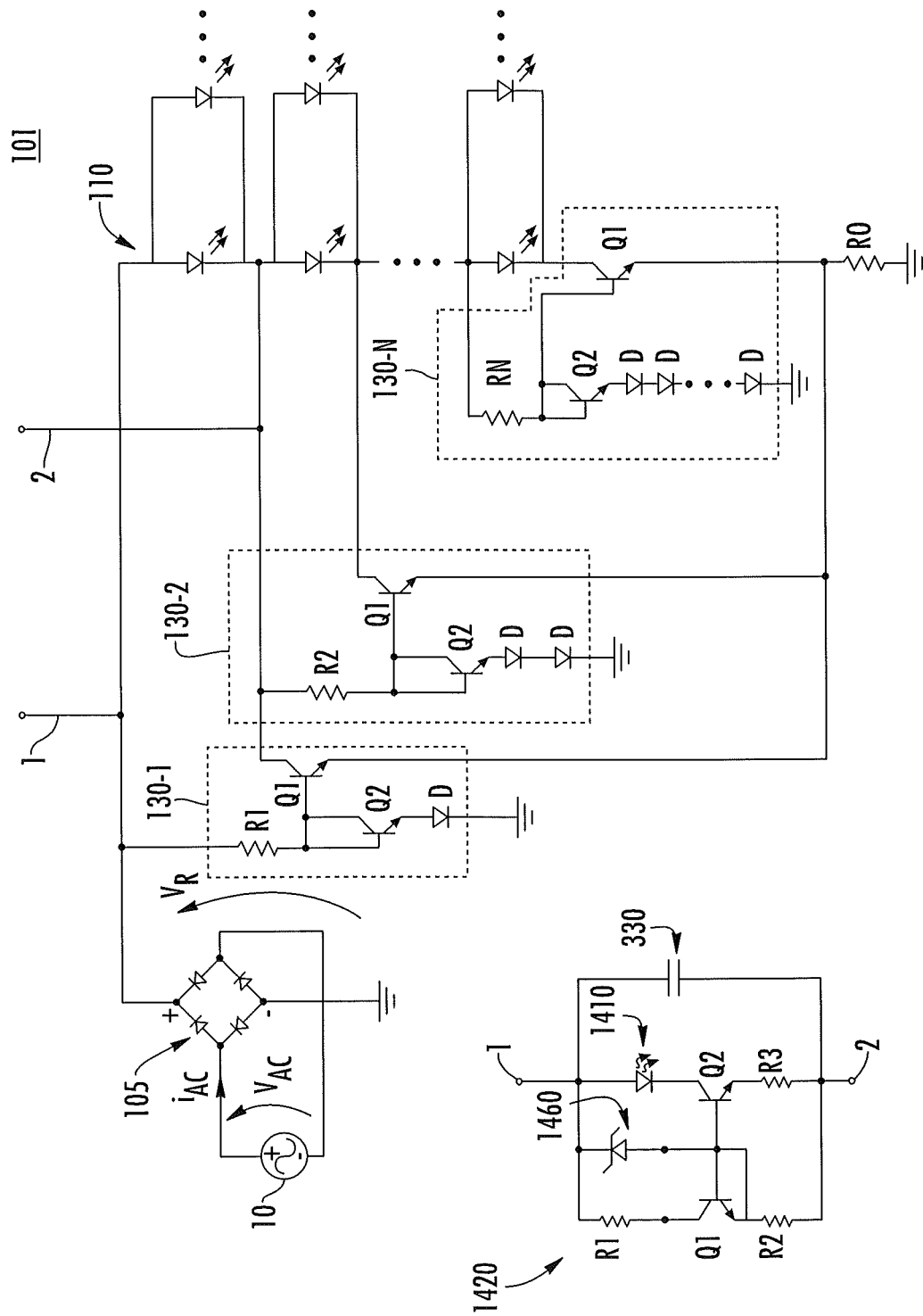
FIG. 13A is a circuit schematic diagram illustrating an LED driver circuit coupled to an LED string circuit in some embodiments according to the invention.

FIG. 13A is a circuit schematic diagram illustrating an LED driver circuit coupled to an LED string circuit in some embodiments according to the invention. The apparatus 101 includes a string 110 of serially connected LED sets 110-1, 110-2, . . . , 110-N. Each of the LED sets 110-1, 110-2, . . . , 110-N includes at least one LED. For example, individual ones of the sets may comprise a single LED and/or individual sets may include multiple LEDs connected in various parallel and/or serial arrangements. The sets of LEDs may be configured in a number of different ways and may have various compensation circuits associated therewith, as discussed, for example, in commonly assigned co-pending U.S. application Ser. No. 13/235,103. U.S. application Ser. No. 13/235,127

Power is provided to the LED string 110 from a rectifier circuit 105 that is configured to be coupled to an ac power source 10 and to produce a rectified voltage $v_R$ and current $i_R$ therefrom. The rectifier circuit 105 may be included in the lighting apparatus 101 or may be part of a separate unit coupled to the apparatus 101.

The apparatus 101 further includes respective current diversion circuits 130-1, 130-2, . . . , 130-N connected to respective nodes of the string 110. The current diversion circuits 130-1, 130-2, . . . , 130-N are configured to provide current paths that bypass respective ones of the LED sets 110-1, 110-2, . . . , 110-N. The current diversion circuits 130-1, 130-2, . . . , 130-N each include a transistor Q1 that is configured to provide a controlled current path that may be used to selectively bypass the LED sets 110-1, 110-2, . . . , 110-N. The transistors Q1 are biased using transistors Q2, resistors R1, R2, . . . , RN and diodes D. The transistors Q2 are configured to operate as diodes, with their base and collector terminals connected to one another. Differing numbers of diodes D are connected in series with the transistors Q2 in respective ones of the current diversion circuits 130-1, 130-2, . . . , 130-N, such that the base terminals of current path transistors Q1 in the respective current diversion circuits 130-1, 130-2, . . . , 130-N are biased at different voltage levels. Resistors R1, R2, . . . , RN serve to limit base currents for the current path transistors Q1. The current path transistors Q1 of the respective current diversion circuits 130-1, 130-2, . . . , 130-N will turn off at different emitter bias voltages, which are determined by a current flowing through a resistor R0. Accordingly, the current diversion circuits 130-1, 130-2, . . . , 130-N are configured to operate in response to bias state transitions of the LED sets 110-1, 110-2, . . . , 110-N as the rectified voltage $v_R$ increases and decreases such that the LED sets 110-1, 110-2, . . . , 110-N are incrementally activated and deactivated as the rectified voltage $v_R$ rises and falls. The current path transistors Q1 are turned on and off as bias states of the LED sets 110-1, 110-2, . . . , 110-N change.

As further shown in FIG. 13A, the string 110 of serially connected LED sets is also coupled in series with a current limiter circuit, which is embodied as a current mirror circuit 1420, although any type of current limiter circuit may be used in embodiments according to the invention. One or more storage capacitors 310 are coupled in parallel with the string 110 of serially connected LED sets and the current mirror circuit 1420. The current mirror circuit 1420 may be configured to limit current through the string 110 of serially connected LED sets to an amount that is less than a nominal current provided to the string circuit 110.

As further shown in FIG. 13A, the current mirror circuit 1420 includes first and second transistors Q1, Q2 and resistors R1, R2, R3 connected in the current mirror configuration. The current mirror circuit 1420 may provide a current limit of approximately $(V_{LED}-0.7)/(R1+R2)\times(R2/R3)$. A voltage limiter circuit 1460, e.g., a zener diode, may also be provided to limit the voltage developed across the one or more storage capacitors 310. In this manner, the one or more storage capacitors 310 may be alternately charged via the rectifier circuit 105 and discharged via the string 110 of serially connected LED sets, which may provide more uniform illumination. The current mirror circuit 1420 is coupled to an LED set 1410, which is included among the plurality of LED sets in the string circuit 110. It will be understood that the LED set 1410 can include multiple LEDs coupled in parallel with one another.

Figure 13B:
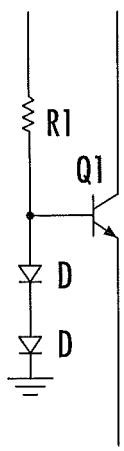
FIGS. 13B-D are circuit schematic diagrams illustrating current diversion circuits in some embodiments according to the invention.
Figure 13C:
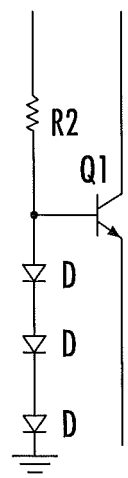
Figure 13D:
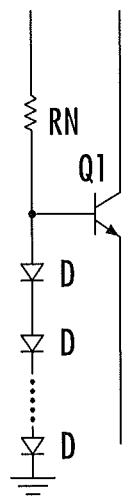

FIGS. 13B-D are circuit schematic diagrams illustrating current diversion circuits in some embodiments according to the invention. In particular, the transistors Q2 shown in FIG. 13A as part of the current diversion circuits 130-1-130-N, are replaced by diodes D in FIGS. 13B-D, to provide sufficient biasing of the respective base of the associated transistor Q1. Further, each of the current diversion circuits 130-1-130-N stages includes a corresponding number of diodes D to provide the biasing otherwise provided by the transistor Q2. For example, the first stage 130-1 includes two diodes for biasing, whereas the next stage 130-2 includes three diodes D for biasing. Moreover, each of the stages 130-1-130-N can share the diodes D of the preceding stage for biasing.

Figure 13E:
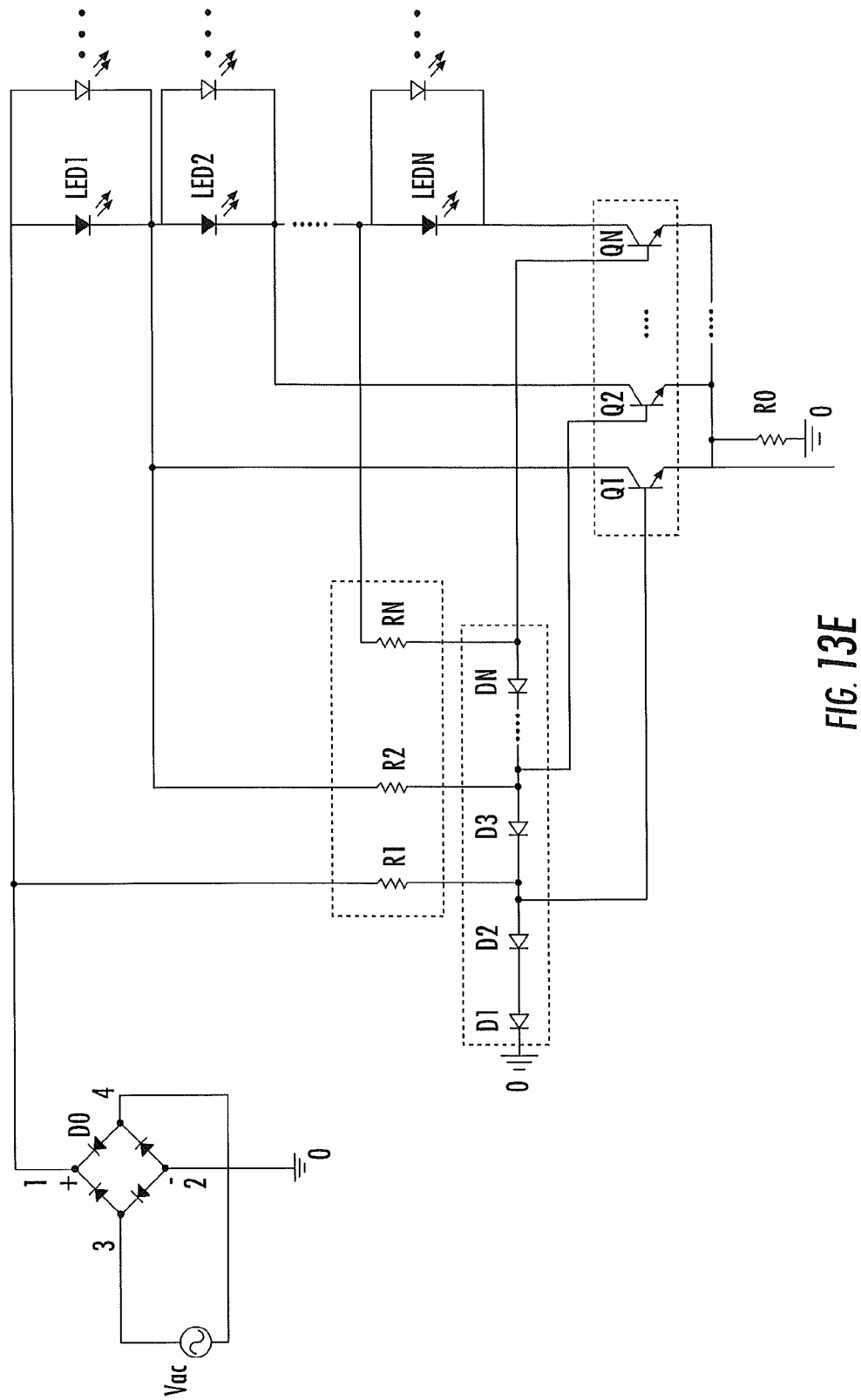
FIG. 13E is a circuit schematic diagram illustrating an LED driver circuit coupled to an LED string circuit in some embodiments according to the invention.

FIG. 13E is a circuit schematic diagram illustrating an LED driver circuit coupled to an LED string circuit in some embodiments according to the invention. FIG. 13E shows the current diversion circuits of FIGS. 13B-D used in the place of the current diversion circuits 130-1-130-N. According to FIG. 13E, in the first segment, the base voltage of Q1 is about equal to the voltage drop of (D1+D2). In the second segment, the base voltage of Q2 is about equal to the voltage drop of (D1+D2+D3). In the N segment, the base voltage of QN is about equal to the voltage drop of (D1+D2+ . . . +DN). Accordingly, in some embodiments according to the invention, the current diversion circuits can be fabricated as an array of diodes and a block of transistors. In some embodiments according to the invention, the array of diodes and the block of transistors can be integrated together or separated from one another.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the term light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed is:

1. A solid state lighting apparatus comprising:
   a rectifier circuit mounted on a surface of a substrate housed in the solid state lighting apparatus, coupled to an ac voltage source configured to provide a rectified ac voltage to the substrate;
   a current source circuit mounted on the surface of the substrate, coupled to the rectifier circuit;
   a string of light emitting diode (LED) sets, mounted on the surface of the substrate, coupled in series with one another and to the current source circuit; and
   a plurality of current diversion circuits mounted on the surface of the substrate, respective ones of which are coupled to respective nodes of the string and configured to operate responsive to bias state transitions of respective ones of the LED sets.

2. The apparatus of claim 1, wherein at least the plurality of current diversion circuits comprise discrete electronic component packages mounted on the substrate.

3. The apparatus of claim 1, wherein the LEDs in the string comprise chip-on-board LEDs mounted on the surface of the substrate.

4. The apparatus of claim 1, wherein the substrate comprises a flexible circuit substrate, the apparatus further comprising:
   a heat sink mounted on an opposing surface of the substrate, thermally coupled to the string of LED sets.

5. The apparatus of claim 1, wherein the substrate comprises a metal core printed circuit board (MCPCB).

6. The apparatus of claim 5 wherein the MCPCB comprises a metal layer separated from the surface of the substrate by a dielectric layer and configured to conduct heat away from the string of LED sets.

7. The apparatus of claim 5 wherein the MCPCB comprises a dielectric material between first and second metal layers.

8. The apparatus of claim 7 wherein the first metal layer comprises a circuit layer and the second metal layer is configured to conduct heat away from the string of LED sets.

9. The apparatus of claim 1, further comprising:
   a current limiter circuit, on the surface of the substrate, in series with the current source circuit and at least one of the LED sets; and
   at least one capacitor, on the surface of the substrate, coupled across the at least one LED set and the current limiter circuit.

10. The apparatus of claim 9 wherein the current limiter circuit is configured to selectively provide current from the current source circuit to the at least one LED set and to the at least one capacitor.

11. The apparatus of claim 9 wherein the rectifier circuit, the current source circuit, the plurality of current diversion circuits, and the current limiter circuit are integrated in an application specific integrated circuit.

12. The apparatus of claim 1 further comprising:
an encapsulant layer, on the surface of the substrate, encapsulating the string of LED sets.

13. The apparatus of claim 12 wherein the encapsulant layer comprises silicone.

14. The apparatus of claim 1 further comprising:
separate encapsulant layers encapsulating LEDs in the string of LED sets, separately.

15. The apparatus of claim 1 wherein the rectifier circuit, the current source circuit, and the plurality of current diversion circuits are included in a single integrated circuit device package.

16. The apparatus of claim 1, wherein the substrate comprises a silicon substrate, a gallium nitride substrate, a silicon carbide substrate or a graphene substrate.

17. The apparatus of claim 1 further comprising:
an encapsulant barrier, on the substrate, at least partially surrounding LEDs in the sets, configured to reduce a flow of an encapsulant material away from the LEDs during application of the encapsulant material to promote formation of lenses on the string of LED sets.

18. The apparatus of claim 17 wherein a height of the encapsulant barrier above the substrate is less than a height of an upper surface of the LEDs.

19. The apparatus of claim 1 wherein the string of LED sets includes at least three sets coupled in series with one another, each of the three sets including at least two high voltage LEDs coupled in parallel with one another.

20. The apparatus of claim 1, wherein the ac voltage source comprises at least about 110 volts ac.

21. The apparatus of claim 1 wherein the string of LED sets includes at least three sets coupled in series with one another, each of the three sets including at least two high voltage LEDs coupled in series with one another.

22. The apparatus of claim 1, wherein the ac voltage source comprises at least about 220 volts ac.

23. The apparatus of claim 1, wherein at least one set of the string of LED sets comprises at least two high voltage LEDs coupled in parallel or is series with one another and the ac voltage source comprises at least about 110 volts ac or about 220 volts ac.

24. A solid state lighting apparatus comprising:
a substrate having first and second opposing surfaces, at least one of which is configured to mount devices thereon;
a string of chip-on-board light emitting diode (LED) sets, on the first surface of the substrate, coupled in series with one another; and
an ac voltage source input, from outside the solid state lighting apparatus, coupled to the first or second surface of the substrate.

25. The apparatus of claim 24 further comprising:
a rectifier circuit on the first or second surface of the substrate, coupled to the ac voltage source input to provide a rectified ac voltage to the substrate;
a current source circuit on the first or second surface of the substrate, coupled to the rectifier circuit; and
a plurality of current diversion circuits on the first or second surface of the substrate, respective ones of which are coupled to respective nodes of the string and configured to operate responsive to bias state transitions of respective ones of the LED sets.

26. The apparatus of claim 25, wherein at least the plurality of current diversion circuits comprise discrete electronic component packages mounted on the first surface of the substrate.

27. The apparatus of claim 25 wherein the substrate comprises a flexible circuit substrate, the apparatus further comprising:
a thermally conductive slug in the substrate at a particular position opposite where the string of chip-on-board LED sets are to be mounted thereon.

28. The apparatus of claim 25, further comprising:
a current limiter circuit, on the first or second surface of the substrate, in series with the current source circuit and at least one of the LED sets; and
at least one capacitor, on the first or second surface of the substrate, coupled across the at least one LED set and the current limiter circuit.

29. The apparatus of claim 24, wherein the substrate comprises a flexible circuit substrate, the apparatus further comprising:
a heat sink on the second side of the substrate, thermally coupled to the string of chip-on-board LED sets.

30. The apparatus of claim 24, wherein the substrate comprises a metal core printed circuit board.

31. The apparatus of claim 24 wherein LEDs in the string of chip-on-board LED sets comprise unpackaged light emitting diodes mounted on the substrate.

32. The apparatus of claim 24 wherein the string of chip-on-board LED sets includes at least three sets coupled in series with one another, each of the three sets including at least two chip-on-board high voltage LEDs coupled in parallel with one another.

33. The apparatus of claim 24 wherein the ac voltage source input comprises at least about 110 volts ac.

34. The apparatus of claim 24 wherein the string of chip-on-board LED sets includes at least three sets coupled in series with one another, each of the three sets including at least two high voltage chip-on-board LEDs coupled in series with one another.

35. The apparatus of claim 24, wherein the ac voltage source input comprises at least about 220 volts ac.

36. The apparatus of claim 24, wherein at least one set of the string of chip-on-board LED sets comprises at least two high voltage chip-on-board LEDs coupled in parallel or is series with one another and the ac voltage source comprises at least about 110 volts ac or about 220 volts ac.

37. A solid state lighting apparatus comprising:
a rectifier circuit configured to be coupled to an ac voltage source to provide a rectified ac voltage;
a current source circuit coupled to the rectifier circuit;
a string of serially-connected LED sets coupled to an output of the current source circuit;
at least one capacitor coupled to the output of the current source circuit;
a current limiter circuit comprising a current mirror circuit configured to limit a current through at least one of the LED sets to less than a current produced by the current source circuit and to cause the at least one capacitor to be selectively charged via the current source circuit and discharged via the at least one of the LED sets responsive to the rectified ac voltage applied to an input of the current source circuit;
a plurality of current diversion circuits coupled to respective nodes between LEDs in the string and configured to be selectively enabled and disabled responsive to bias state transitions of the LED sets as a magnitude of the rectified ac voltage varies; and a substrate having first and second opposing surfaces, wherein at least the string of serially-connected LED sets, the plurality of current diversion circuits, the rectifier circuit, and the current source circuit are mounted on the substrate.

38. The apparatus of claim 37 wherein the plurality of current diversion circuits each comprises:
   a transistor providing a controllable current path between a first node of the string and a terminal of the rectifier circuit; and
   a turn-off circuit coupled to a second node of the string and to a control terminal of the transistor and configured to control the current path responsive to a control input.

39. The apparatus of claim 37 wherein the LEDs in the string comprise chip-on-board LEDs mounted on the substrate.

40. The apparatus of claim 37, wherein the substrate comprises a flexible circuit board, the apparatus further comprising:
   a heat sink mounted on the substrate opposite and proximate to the string of LED sets.

41. The apparatus of claim 37, wherein the substrate comprises a metal core printed circuit board (MCPCB).

42. The apparatus of claim 41 wherein the MCPCB comprises a metal layer separated from the surface of the substrate by a dielectric layer and configured to conduct heat away from the string of LED sets.

43. The apparatus of claim 37, wherein the substrate comprises a flexible printed circuit board.

44. The apparatus of claim 37, wherein at least the plurality of current diversion circuits comprise discrete electronic component packages mounted on the substrate.

45. The apparatus of claim 37 wherein the string of serially-connected LED sets includes at least three sets coupled in series with one another, each of the three sets including at least two chip-on-board high voltage LEDs coupled in parallel with one another.

46. The apparatus of claim 37 wherein the ac voltage source input comprises at least about 110 volts ac.

47. The apparatus of claim 37 wherein the string of serially-connected LED sets includes at least three sets coupled in series with ore another, each of the three sets including at least two high voltage chip-on-board LEDs coupled in series with one another.

48. The apparatus of claim 37 wherein the ac voltage source input comprises at least about 220 volts ac.

49. The apparatus of claim 37 wherein at least one set of the string of serially-connected LED sets comprises at least two high voltage chip-on-board LEDs coupled in parallel or is series with one another and the ac voltage source comprises at least about 110 volts ac or about 220 volts ac.

50. A method of forming a solid state lighting circuit, comprising:
   placing a plurality chip-on-board light emitting diodes (LEDs) in a string configuration on a surface of a substrate;
   applying an encapsulant material over the plurality of chip-on-board LEDs; and
   forming the encapsulant material into a layer covering the plurality of chip-on-board LEDs to provide lenses for the plurality of chip-on-board LEDs.

51. The method according to claim 50 further comprising:
   placing a plurality of current diversion circuits, comprising discrete electronic component packages, on the surface of the substrate.

52. The method according to claim 50 wherein applying an encapsulant material comprises applying the encapsulant material to cover the plurality of chip-on-board LEDs and portions of the surface between ones of the plurality of chip-on-board LEDs.

53. The method according to claim 52 wherein forming the encapsulant material into a layer comprises bringing a mold into contact with the encapsulant material to simultaneously form a layer covering the plurality chip-on-board LEDs to provide the lenses for the plurality chip-on-board LEDs, wherein the mold includes chip-on-board LED recesses positioned in a surface of the mold opposite the plurality of chip-on-board LEDs.

54. The method according to claim 53 further comprising:
   placing a plurality of current diversion circuits, comprising discrete electronic component packages, on the surface of the substrate before applying the encapsulant material, wherein the mold further includes discrete electronic component package recesses positioned in the surface of the mold opposite the plurality of current diversion circuits on the surface.

55. The method according to claim 50 wherein applying an encapsulant material comprises dispensing the encapsulant material separately onto the plurality of chip-on-board LEDs.

56. The method according to claim 50 wherein applying an encapsulant material comprises dispensing the encapsulant material simultaneously onto the plurality of chip-on-board LEDs.

57. The method according to claim 56 wherein the encapsulant barrier at least partially surrounds the LEDs and is configured to reduce a flow of the encapsulant material away from the LEDs during application of the encapsulant material to promote the formation of the lenses.

58. The method according to claim 50 wherein forming the encapsulant material into a layer covering the plurality chip-on-board LEDs to provide lenses for the plurality chip-on-board LEDs comprises providing respective encapsulant barriers to a flow of the encapsulant material away from each of the plurality chip-on-board LEDs during application of the encapsulant material to provide a respective lens for each of the plurality of chip-on-board LEDs.

59. The method according to claim 58 further comprising:
   removing the encapsulant barriers from the lenses.

60. The method of claim 50 wherein the string configuration comprises serially-connected LED sets and wherein the serially-connected LED sets include at least three sets coupled in series with one another, each of the three sets including at least two chip-on-board high voltage LEDs coupled in parallel with one another.

61. The method of claim 50 wherein the string configuration is configured for coupling to an ac voltage source comprising at least about 110 volts ac.

62. The method of claim 50 wherein the string configuration comprises serially-connected LED sets and wherein the serially-connected LED sets include at least three sets coupled in series with one another, each of the three sets including at least two high voltage chip-on-board LEDs coupled in series with one another.

63. The method of claim 50 wherein the string configuration is configured for coupling to an ac voltage source comprising at least about 220 volts ac.

64. The method of claim 50 wherein the string configuration is configured for coupling to an ac voltage source and wherein the string configuration comprises serially-connected LED sets and wherein at least one set of the string of serially-connected LED sets comprises at least two high voltage chip-on-board LEDs coupled in parallel or is series with one another and the ac voltage source comprises at least about 110 volts ac or about 220 volts ac.

65. A printed circuit board (PCB) comprising:
a substrate, configured for inclusion in a solid state lighting apparatus, the substrate having first and second opposing surfaces, at least one of which is configured to mount a plurality of chip-on-board light emitting diodes (LEDs) thereon, and the substrate configured to couple to an ac voltage source input, from outside the solid state lighting apparatus, and configured for mounting a plurality of discrete current diversion circuits devices thereon coupled to respective nodes between ones of the LEDs and configured to be selectively enabled and disabled responsive to bias state transitions of the LED sets as a magnitude of a rectified ac voltage provided to the LEDs varies.

66. The PCB of claim 65 wherein the substrate comprises a metal core PCB.

67. The PCB of claim 66 wherein the first surface comprises a conductive circuit pattern layer and the second surface comprises a base metal layer having a greater thickness than the conductive circuit pattern layer, the PCB further comprising a dielectric layer between the conductive circuit pattern layer and the base metal layer.

68. The PCB of claim 65 wherein the substrate comprises a flexible PCB.

69. The PCB of claim 68 further comprising:
a thermally conductive slug in the substrate at a particular position opposite where the string of chip-on-board LED sets are to be mounted thereon.

70. The PCB of claim 65 further comprising:
an encapsulant barrier, protruding from the surface, at least partially surrounding a position on the surface where at least one of the LEDs is to be mounted, configured to reduce a flow of an encapsulant material away from the LEDs during application of the encapsulant material to promote the formation of a lens on the at least one of the LEDs.

71. A solid state lighting apparatus comprising:
a substrate having first and second opposing surfaces, at least one of which is configured to mount devices thereon, the substrate comprising a substrate area;
a string of light emitting diode (LED) sets, on the first surface of the substrate, coupled in series with one another, and arranged in an LED portion of the substrate comprising an LED area that is about 40% or less of the substrate area, the string of LED sets configured to emit light comprising about 2000 lumens or more; and
an ac voltage source input, from outside the solid state lighting apparatus, coupled to the first or second surface of the substrate.

72. A solid state lighting apparatus comprising:
a substrate having first and second opposing surfaces, at least one of which is configured to mount devices thereon, the substrate comprising a substrate area;
a string of light emitting diode (LED) sets, on the first surface of the substrate, coupled in series with one another, and arranged in an LED portion of the substrate comprising an LED area that is about 30% or less of the substrate area, the string of LED sets configured to emit light comprising about 800 lumens or more; and
an ac voltage source input, from outside the solid state lighting apparatus, coupled to the first or second surface of the substrate.

73. A solid state lighting apparatus comprising:
a substrate having first and second opposing surfaces, at least one of which is configured to mount devices thereon, the substrate comprising a substrate area;
a string of light emitting diode (LED) sets, on the first surface of the substrate, coupled in series with one another, and arranged in an LED portion of the substrate comprising an LED area that is about 38% or less of the substrate area, the string of LED sets configured to emit light comprising about 800 lumens or more; and
an ac voltage source input, from outside the solid state lighting apparatus, coupled to the first or second surface of the substrate.

74. The apparatus of claim 73 wherein the string of LED sets includes at least three sets coupled in series with one another, each of the three sets including at least two high voltage LEDs coupled in parallel with one another.

75. The apparatus of claim 73 wherein the ac voltage source input comprises at least about 110 volts ac.

76. The apparatus of claim 73 wherein the string of LED sets includes at least three sets coupled in series with one another, each of the three sets including at least two high voltage LEDs coupled in series with one another.

77. The apparatus of claim 73 wherein the ac voltage source input comprises at least about 220 volts ac.

78. The apparatus of claim 73, wherein at least one set of the string of LED sets comprises at least two high voltage LEDs coupled in parallel or is series with one another and the ac voltage source comprises at least about 110 volts ac or about 220 volts ac.

* * * * *

UNITED STATES PATENT AND TRADEMARK OFFICE
CERTIFICATE OF CORRECTION

PATENT NO.       : 9,510,413 B2
APPLICATION NO.  : 13/360145
DATED            : November 29, 2016
INVENTOR(S)      : Athalye et al.

It is certified that error appears in the above-identified patent and that said Letters Patent is hereby corrected as shown below:

In the Claims

Column 27, Claim 47, Line 48: Please correct "with ore another," to read -- with one another, --

Signed and Sealed this
Sixth Day of June, 2017

Michelle K. Lee
*Director of the United States Patent and Trademark Office*